United States Patent
Goto et al.

(10) Patent No.: US 9,435,024 B2
(45) Date of Patent: Sep. 6, 2016

(54) TARGET FOR MAGNETRON SPUTTERING

(71) Applicant: TANAKA KIKINZOKU KOGYO K.K., Tokyo (JP)

(72) Inventors: Yasuyuki Goto, Tsukuba (JP); Yasunobu Watanabe, Tsukuba (JP); Yusuke Kobayashi, Tsukuba (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 0 days.

(21) Appl. No.: 14/677,013

(22) Filed: Apr. 2, 2015

(65) Prior Publication Data
US 2015/0211109 A1 Jul. 30, 2015

Related U.S. Application Data

(63) Continuation of application No. PCT/JP2013/076096, filed on Sep. 26, 2013.

(30) Foreign Application Priority Data

Oct. 5, 2012 (JP) .................................. 2012-223676

(51) Int. Cl.
*C23C 14/35* (2006.01)
*H01J 37/34* (2006.01)
(Continued)

(52) U.S. Cl.
CPC ............. *C23C 14/3414* (2013.01); *B22F 3/14* (2013.01); *B22F 3/15* (2013.01); *B22F 5/00* (2013.01);
(Continued)

(58) Field of Classification Search
CPC .............. B22F 3/14; B22F 3/15; B22F 5/00; C22C 1/0433; C22C 1/05; C22C 19/07; C22C 32/001; C22C 5/04; C23C 14/3414; C23C 14/35; G11B 5/851; H01J 37/3429
USPC ........................................ 204/298.12, 298.13
See application file for complete search history.

(56) References Cited

U.S. PATENT DOCUMENTS

2013/0175166 A1* 7/2013 Miyashita ............... C22C 19/07
204/298.13

FOREIGN PATENT DOCUMENTS

JP  4422203 B1  2/2010
JP  4673453 B1  4/2011
(Continued)

OTHER PUBLICATIONS

PCT, International Preliminary Report on Patentability for PCT/JP2013/076096, Nov. 17, 2014.
(Continued)

*Primary Examiner* — Rodney McDonald
(74) *Attorney, Agent, or Firm* — Orrick, Herrington & Sutcliffe LLP

(57) ABSTRACT

A target for magnetron sputtering, comprising metal Co, metal Cr, and an oxide with an atomic ratio of the metal Cr to the total of the metal Co and the metal Cr being less than 25 at %, wherein the target comprises: a non-magnetic metal phase containing metal Co and metal Cr with an atomic ratio of the metal Cr to the total of the metal Co and the metal Cr being 25 at % or more and with an atomic ratio of the metal Co to the total of the metal Co and the other metals being more than 0 at % and 45 at % or less; and a magnetic metal phase containing metal Co, wherein a volume ratio of the oxide to the non-magnetic metal phase is more than 0 and 1.2 or less, and wherein the non-magnetic metal phase and the oxide are mutually dispersed.

14 Claims, 9 Drawing Sheets

(51) Int. Cl.
  *C23C 14/34* (2006.01)
  *B22F 3/15* (2006.01)
  *C22C 1/05* (2006.01)
  *C22C 5/04* (2006.01)
  *C22C 19/07* (2006.01)
  *G11B 5/851* (2006.01)
  *C22C 1/04* (2006.01)
  *C22C 32/00* (2006.01)
  *B22F 3/14* (2006.01)
  *B22F 5/00* (2006.01)

(52) U.S. Cl.
  CPC .............. *C22C 1/0433* (2013.01); *C22C 1/05* (2013.01); *C22C 5/04* (2013.01); *C22C 19/07* (2013.01); *C22C 32/001* (2013.01); *C23C 14/35* (2013.01); *G11B 5/851* (2013.01); *H01J 37/3429* (2013.01)

(56) References Cited

FOREIGN PATENT DOCUMENTS

| | | |
|---|---|---|
| JP | 4871406 B1 | 2/2012 |
| TW | 201211298 A | 3/2012 |
| WO | WO 2012/017952 * | 2/2012 |

OTHER PUBLICATIONS

PCT, International Search Report PCT/JP2013/007609, Oct. 29, 2013.

PCT, International Search Report PCT/JP2013/076096, Oct. 29, 2013.

\* cited by examiner

TARGET FOR MAGNETRON SPUTTERING

TECHNICAL FIELD

The present invention relates to a target for magnetron sputtering and a manufacturing method therefor and, in particular, to a target for magnetron sputtering containing Co, Cr, and an oxide and a manufacturing method therefor.

BACKGROUND ART

In magnetron sputtering, magnets are disposed on the rear side of a target, and leakage magnetic flux flowing toward the front side of the target causes plasma to be concentrated at high density. This allows stable high-rate sputtering.

Therefore, the target used for magnetron sputtering is required to allow a large amount of leakage magnetic flux to flow toward the front side of the target.

For example, Patent Literature 1 discloses a magnetron sputtering target containing Co. More specifically, this magnetron sputtering target includes a magnetic phase containing Co, a non-magnetic phase containing Co, and an oxide phase, and the magnetic phase, the non-magnetic phase, and the oxide phase are dispersed in each other. The magnetic phase contains Co and Cr as main components, and the ratio of the amount of Co contained in the magnetic phase is not less than 76 at % and not more than 80 at %. Patent Literature 1 discloses another magnetron sputtering target containing Co. More specifically, this magnetron sputtering target includes a magnetic phase containing Co and a non-magnetic phase containing Co, and the magnetic phase and the non-magnetic phase are dispersed in each other. The non-magnetic phase is a Pt—Co alloy phase containing Pt as a main component, and the ratio of the amount of Co contained in the Pt—Co alloy phase is more than 0 at % and not more than 13 at %.

For example, Patent Literature 2 discloses a magnetron sputtering target containing a ferromagnetic metal element. More specifically, this magnetron sputtering target includes a magnetic phase containing the ferromagnetic metal element, a plurality of non-magnetic phases containing the ferromagnetic metal element, the plurality of non-magnetic phases containing a different constituent element from each other or containing constituent elements at different ratios from each other, and an oxide phase, wherein regions of the magnetic phase and the non-magnetic phases are separated from each other by the oxide phase, the regions of the magnetic phase are separated from each other by the oxide phase, and the regions of the non-magnetic phases are separated from each other by the oxide phase.

These magnetron sputtering targets allow an increased amount of leakage magnetic flux to flow from the surfaces of the targets during magnetron sputtering without reducing the amount of Co, or a ferromagnetic metal element, contained in the targets, so that magnetron sputtering can be performed favorably.

CITATION LIST

Patent Literature

Patent Literature 1: Japanese Patent No. 4422203
Patent Literature 2: Japanese Patent No. 4871406

SUMMARY OF INVENTION

Technical Problem

It can be generally said of sputtering that generation of defects such as nodules and particles needs to be minimized during sputtering. This requirement is also applied to magnetron sputtering.

The present invention has been made in light of such a point. An object of the present invention is to provide a target for magnetron sputtering in which the leakage magnetic flux during magnetron sputtering is kept high without a reduction in the Co content contained in the target, and in which generation of defects such as nodules and particles is unlikely to occur, and a manufacturing method for the target for magnetron sputtering.

Solution to Problem

A first aspect of a target for magnetron sputtering according to the present invention is a target for magnetron sputtering, comprising metal Co, metal Cr, and an oxide with an atomic ratio of the metal Cr to the total of the metal Co and the metal Cr being more than 0 at % and less than 25 at %, wherein the target comprises: a non-magnetic metal phase containing metal Co and metal Cr with an atomic ratio of the metal Cr to the total of the metal Co and the metal Cr being 25 at % or more and less than 100 at %; and a magnetic metal phase containing metal Co, wherein a volume ratio of the oxide to the non-magnetic metal phase is more than 0 and 1.2 or less, wherein the non-magnetic metal phase and the oxide are mutually dispersed, and wherein no aggregated oxide having a longest diameter of 5 µm or larger is present.

A second aspect of a target for magnetron sputtering according to the present invention is a target for magnetron sputtering, comprising metal Co, metal Cr, metal Pt, and an oxide with an atomic ratio of the metal Cr to the total of the metal Co and the metal Cr being more than 0 at % and less than 25 at %, wherein the target comprises: a non-magnetic metal phase containing metal Co, metal Cr, and metal Pt with an atomic ratio of the metal Cr to the total of the metal Co and the metal Cr being 25 at % or more and less than 100 at %; and a magnetic metal phase containing metal Co, wherein a volume ratio of the oxide to the non-magnetic metal phase is more than 0 and 1.2 or less, wherein the non-magnetic metal phase and the oxide are mutually dispersed, and wherein no aggregated oxide having a longest diameter of 5 µm or larger is present.

A third aspect of a target for magnetron sputtering according to the present invention is a target for magnetron sputtering, comprising metal Co, metal Cr, and an oxide with an atomic ratio of the metal Cr to the total of the metal Co and the metal Cr being more than 0 at % and less than 25 at %, wherein the target comprises: a non-magnetic metal phase containing metal Co and metal Cr with an atomic ratio of the metal Cr to the total of the metal Co and the metal Cr being 25 at % or more and less than 100 at % and with an atomic ratio of the metal Co to the total of the metal Co and the other metals being more than 0 at % and 45 at % or less; and a magnetic metal phase containing metal Co, wherein a volume ratio of the oxide to the non-magnetic metal phase is more than 0 and 1.2 or less, and wherein the non-magnetic metal phase and the oxide are mutually dispersed.

A fourth aspect of a target for magnetron sputtering according to the present invention is a target for magnetron sputtering, comprising metal Co, metal Cr, metal Pt, and an oxide with an atomic ratio of the metal Cr to the total of the metal Co and the metal Cr being more than 0 at % and less than 25 at %, wherein the target comprises: a non-magnetic metal phase containing metal Co, metal Cr, and metal Pt with an atomic ratio of the metal Cr to the total of the metal Co and the metal Cr being 25 at % or more and less than 100 at % and with an atomic ratio of the metal Co to the total of the metal Co and the other metals being more than 0 at % and 45 at % or less; and a magnetic metal phase containing metal Co, wherein a volume ratio of the oxide to the non-magnetic metal phase is more than 0 and 1.2 or less, and wherein the non-magnetic metal phase and the oxide are mutually dispersed.

Herein, the "magnetic metal phase" is a metal phase with magnetism (except for phases with magnetism sufficiently lower than the magnetism of ordinary magnetic substances), and the "non-magnetic metal phase" is a concept including not only metal phases with no magnetism but also metal phases with magnetism sufficiently lower than the magnetism of ordinary magnetic substances.

The phrase "the non-magnetic metal phase and the oxide are mutually dispersed" is a concept including a state in which the non-magnetic metal phase is a dispersion medium and the oxide is a dispersoid and a state in which the oxide is a dispersion medium and the non-magnetic metal phase is a dispersoid and further including a state in which the non-magnetic metal phase and the oxide are mutually mixed but it is not possible to determine which phase is a dispersion medium and which phase is a dispersoid.

The "longest diameter" of the aggregated oxides refers to the maximum diameter of the aggregated oxides when the diameter of the aggregated oxides is determined in all directions by changing the direction (the diameter of the particle material formed by aggregation of the oxides).

The volume ratio of magnetic metal phase having an aspect ratio of 2 or more among the magnetic metal phase is preferably 0.5 or less with respect to the total magnetic metal phase in order to increase the leakage magnetic flux.

In the present specification, the aspect ratio of the magnetic metal phase refers to the value obtained by dividing the longest diameter of the magnetic metal phase (the maximum diameter of the magnetic metal phase when the diameter of the magnetic metal phase is determined in all directions by changing the direction) by the shortest diameter (the minimum diameter of the magnetic metal phase when the diameter of the magnetic metal phase is determined in all directions by changing the direction).

The non-magnetic metal phase preferably has an atomic ratio of metal Cr of 30 at % or more and less than 100 at % with respect to the total of metal Co and the metal Cr contained in order to reduce the magnetism as the entire target to increase the leakage magnetic flux from the target surface.

It is preferable that the magnetic metal phase contains metal Co and metal Cr with the balance being unavoidable impurities and the atomic ratio of the metal Co to the total of the metal Co and the metal Cr be more than 85 at % or more and less than 100 at % in order to reduce the magnetism as the entire target to increase the leakage magnetic flux from the target surface.

It is more preferable that the magnetic metal phases be free of Cr and the magnetic metal phases be magnetic metal phase consisting of metal Co and unavoidable impurities in order to reduce the magnetism as the entire target to increase the leakage magnetic flux from the target surface.

For example, the oxide may contain at least one of $SiO_2$, $TiO_2$, $Ti_2O_3$, $Ta_2O_5$, $Cr_2O_3$, $CoO$, $Co_3O_4$, $B_2O_3$, $Fe_2O_3$, $CuO$, $Y_2O_3$, $MgO$, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

Since any of the targets contains ferromagnetic metal element Co, some of the targets can be suitably used for forming a magnetic recording layer having excellent magnetic recording characteristics.

The first aspect of a target for magnetron sputtering according to the present invention can be manufactured by, for example, a manufacturing method for a target for magnetron sputtering, the method comprising the steps of: mixing and dispersing non-magnetic metal powder and oxide powder to obtain a non-magnetic powder mixture, the non-magnetic metal powder containing metal Co and metal Cr with an atomic ratio of the metal Cr to the total of the metal Co and the metal Cr being 25 at % or more and less than 100 at %, the oxide powder being mixed at a volume ratio of more than 0 and 1.2 or less with respect to the non-magnetic metal powder; mixing and dispersing the obtained non-magnetic powder mixture and magnetic metal powder containing metal Co to obtain a powder mixture for pressure sintering; and pressure sintering the obtained powder mixture for pressure sintering, wherein no aggregated oxide having a longest diameter of 5 μm or larger is present in the obtained sintered product.

The second aspect of a target for magnetron sputtering according to the present invention can be manufactured by, for example, a manufacturing method for a target for magnetron sputtering, the method comprising the steps of: mixing and dispersing non-magnetic metal powder and oxide powder to obtain a non-magnetic powder mixture, the non-magnetic metal powder containing metal Co, metal Cr, and metal Pt with an atomic ratio of the metal Cr to the total of the metal Co and the metal Cr being 25 at % or more and less than 100 at %, the oxide powder being mixed at a volume ratio of more than 0 and 1.2 or less with respect to the non-magnetic metal powder; mixing and dispersing the obtained non-magnetic powder mixture and magnetic metal powder containing metal Co to obtain a powder mixture for pressure sintering; and pressure sintering the obtained powder mixture for pressure sintering, wherein no aggregated oxide having a longest diameter of 5 μm or larger is present in the obtained sintered product.

The third aspect of a target for magnetron sputtering according to the present invention can be manufactured by, for example, a manufacturing method for a target for magnetron sputtering, the method comprising the steps of: mixing and dispersing non-magnetic metal powder and oxide powder to obtain a non-magnetic powder mixture, the non-magnetic metal powder containing metal Co and metal Cr with an atomic ratio of the metal Cr to the total of the metal Co and the metal Cr being 25 at % or more and less than 100 at % and with an atomic ratio of the metal Co to the total of the metal Co and the other metals being more than 0 at % and 45 at % or less, the oxide powder being mixed at a volume ratio of more than 0 and 1.2 or less with respect to the non-magnetic metal powder; mixing and dispersing the obtained non-magnetic powder mixture and magnetic metal powder containing metal Co to obtain a powder mixture for pressure sintering; and pressure sintering the obtained powder mixture for pressure sintering.

The fourth aspect of a target for magnetron sputtering according to the present invention can be manufactured by, for example, a manufacturing method for a target for magnetron sputtering, the method comprising the steps of: mixing and dispersing non-magnetic metal powder and oxide powder to obtain a non-magnetic powder mixture, the non-magnetic metal powder containing metal Co, metal Cr, and metal Pt with an atomic ratio of the metal Cr to the total of the metal Co and the metal Cr being 25 at % or more and less than 100 at % and with an atomic ratio of the metal Co to the total of the metal Co and the other metals being more than 0 at % and 45 at % or less, the oxide powder being mixed at a volume ratio of more than 0 and 1.2 or less with respect to the non-magnetic metal powder; mixing and dispersing the obtained non-magnetic powder mixture and magnetic metal powder containing metal Co to obtain a powder mixture for pressure sintering; and pressure sintering the obtained powder mixture for pressure sintering.

Herein, the "magnetic metal powder" is a powder with magnetism (except for powders with magnetism sufficiently lower than the magnetism of ordinary magnetic substances), and the "non-magnetic powders" are a concept including not only powders with no magnetism but also powders with magnetism sufficiently lower than the magnetism of ordinary magnetic substances.

It is preferable not to provide the step of mixing and dispersing the magnetic metal powder with a ball mill in order to further increase the leakage magnetic flux of the target obtained.

The non-magnetic metal powder preferably has an atomic ratio of metal Cr of 30 at % or more and less than 100 at % with respect to the total of metal Co and the metal Cr contained in order to reduce the magnetism as the entire target to be produced to increase the leakage magnetic flux from the target surface.

The magnetic metal powder preferably contains metal Co and metal Cr with the balance being unavoidable impurities and the atomic ratio of the metal Co to the total of the metal Co and the metal Cr is preferably 85 at % or more and less than 100 at % in order to reduce the magnetism as the entire target to be produced to increase the leakage magnetic flux from the target surface.

The magnetic metal powder preferably consists of metal Co and unavoidable impurities in order to reduce the magnetism as the entire target to be produced to increase the leakage magnetic flux from the target surface.

For example, the oxide used in the above-described manufacturing method may contain at least one of $SiO_2$, $TiO_2$, $Ti_2O_3$, $Ta_2O_5$, $Cr_2O_3$, $CoO$, $CO_3O_4$, $B_2O_3$, $Fe_2O_3$, $CuO$, $Y_2O_3$, $MgO$, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

The fifth aspect of a target for magnetron sputtering according to the present invention is a target obtained by the above-described manufacturing method.

Advantageous Effects of Invention

The present invention can provide a target for magnetron sputtering in which the leakage magnetic flux during magnetron sputtering is kept high without a reduction in the Co content contained in the target, and in which generation of defects such as nodules and particles is unlikely to occur, and a method for producing the target for magnetron sputtering.

DESCRIPTION OF EMBODIMENTS

Figure 1:
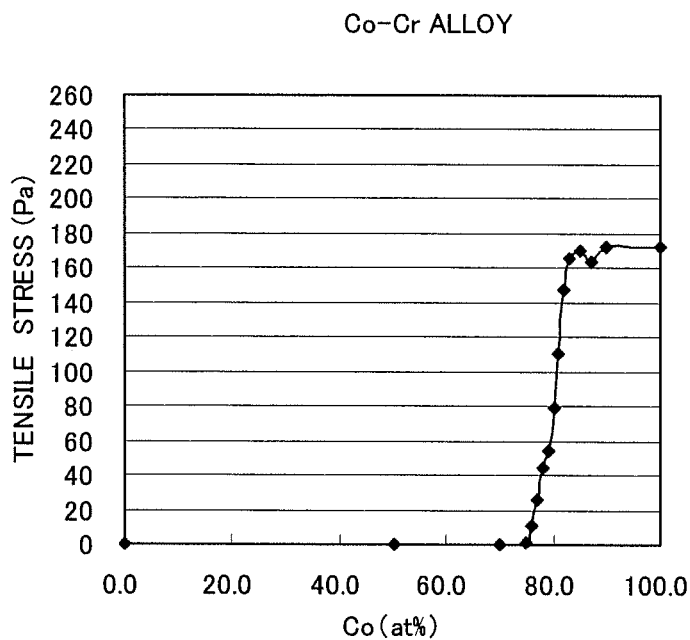
FIG. 1 is a graph showing the relationship between the ratio of the amount of Co and magnetism of a Co—Cr alloy.

A first aspect of a target for magnetron sputtering according to the present invention is a target for magnetron sputtering, comprising metal Co, metal Cr, and an oxide with an atomic ratio of the metal Cr to the total of the metal Co and the metal Cr being more than 0 at % and less than 25 at %, wherein the target comprises: a non-magnetic metal phase containing metal Co and metal Cr with an atomic ratio of the metal Cr to the total of the metal Co and the metal Cr being 25 at % or more and less than 100 at %; and a magnetic metal phase containing metal Co, wherein a volume ratio of the oxide to the non-magnetic metal phase is more than 0 and 1.2 or less, wherein the non-magnetic metal phase and the oxide are mutually dispersed, and wherein no aggregated oxide having a longest diameter of 5 μm or larger is present.

A second aspect of a target for magnetron sputtering according to the present invention is a target for magnetron sputtering, comprising metal Co, metal Cr, metal Pt, and an oxide with an atomic ratio of the metal Cr to the total of the metal Co and the metal Cr being more than 0 at % and less than 25 at %, wherein the target comprises: a non-magnetic metal phase containing metal Co, metal Cr, and metal Pt with an atomic ratio of the metal Cr to the total of the metal Co and the metal Cr being 25 at % or more and less than 100 at %; and a magnetic metal phase containing metal Co, wherein a volume ratio of the oxide to the non-magnetic metal phase is more than 0 and 1.2 or less, wherein the non-magnetic metal phase and the oxide are mutually dispersed, and wherein no aggregated oxide having a longest diameter of 5 μm or larger is present.

In both the first and second aspects of the target for magnetron sputtering according to the present invention, the atomic ratio of metal Cr to the total of metal Co and metal Cr is more than 0 at % and less than 25 at % in the composition of the entire target. Therefore, if the target includes one type of metal phase, the atomic ratio of metal Cr to the total of metal Co and metal Cr in the metal phase will naturally be more than 0 at % and less than 25 at % (the atomic ratio of metal Co to the total of metal Co and metal Cr is 75 at % or more and less than 100 at %). With this atomic ratio, the metal phase in the target will be a magnetic phase, as described below, so that the leakage magnetic flux from the target surface is reduced during magnetron sputtering.

In both the first and second aspects of the target for magnetron sputtering according to the present invention, the target for magnetron sputtering includes a non-magnetic metal phase having an atomic ratio of metal Cr to the total of metal Co and the metal Cr of 25 at % or more and less than 100 at % and a magnetic metal phase containing metal Co. As more Co is contained in the magnetic metal phase, less Co is contained in the other metal phase, so that the atomic ratio of metal Cr to the total of metal Co and the metal Cr is 25 at % or more and less than 100 at % in the other metal phase. As a result, substantially zero magnetism of the other metal phase is achieved (the reason of substantially zero magnetism will be described below).

In other words, in the first and second aspects of the target for magnetron sputtering according to the present invention, the atomic ratio of metal Cr to the total of metal Co and metal Cr is more than 0 at % and less than 25 at % in the composition of the entire target, while the atomic ratio of metal Cr to the total of metal Co and metal Cr is 25 at % or more and less than 100 at % in the composition of the non-magnetic metal phase. This atomic ratio causes substantially zero magnetism of the non-magnetic metal phase to reduce the magnetism as the entire target with a constant content of metal Co in the entire target.

This increases the leakage magnetic flux from the target surface during magnetron sputtering to enable favorable magnetron sputtering in both the first and second aspects of the target for magnetron sputtering according to the present invention.

In both the first and second aspects of the target for magnetron sputtering according to the present invention, the volume ratio of the oxide to the non-magnetic metal phase is more than 0 and 1.2 or less. Because of this, the volume ratio of the oxide powder to the non-magnetic metal powder is as small as 1.2 or less in terms of the non-magnetic metal powder and oxide powder that constitute a powder mixture for target production. This volume ratio facilitates good mixing of the non-magnetic metal powder and the oxide powder in the production of the powder mixture for target production (on the other hand, too much volume of the oxide powder to the non-magnetic metal powder easily causes poor mixing of the non-magnetic metal powder and the oxide powder). As a result, the non-magnetic metal phase and the oxide can be mutually dispersed in both the first and second aspects of the target for magnetron sputtering according to the present invention. Also, the non-magnetic metal phase and the oxide easily form a structure in which they are finely dispersed in each other.

In Comparative Example 2 described below in the section of [Examples], however, the volume ratio of the oxide powder to the non-magnetic metal powder was 1.2 or less in terms of the non-magnetic metal powder and oxide powder that constitute a powder mixture for target production, but aggregated oxides having a major axis of 5 μm or larger were found in the obtained target. It is considered that even if the volume ratio of the oxide powder to the non-magnetic metal powder is 1.2 or less in terms of the non-magnetic metal powder and oxide powder that constitute a powder mixture for target production, good mixing of the metal powder and the oxide would not be achieved depending on the composition of the metal powder constituting the powder mixture for target production, and aggregated oxides having a longest diameter of 5 μm or larger may be found in the obtained target. Because of this, the first and second aspects of the target for magnetron sputtering according to the present invention have an additional constitutional requirement that the target for magnetron sputtering is free of aggregated oxides having a longest diameter of 5 μm or larger. Thus, targets containing aggregated oxides having a longest diameter of 5 µm or larger are excluded from the first and second aspects of the target for magnetron sputtering according to the present invention.

Next, the reason that the atomic ratio of metal Cr to the total of metal Co and metal Cr is 25 at % or more and less than 100 at % in the non-magnetic metal phase in the first and second aspects of the target for magnetron sputtering according to the present invention will be described.

TABLE 1 below shows the experimental results of the measurement of the tensile stresses of Co—Cr alloys with different ratios of amounts of Co. The tensile stress is used as a measure for evaluation of magnetism (the larger the value of the tensile stress, the larger the magnetism, as described later). FIG. 1 is a graph based on TABLE 1 below and showing the relationship between the ratio of the amount of Co in the Co—Cr alloy and its magnetism. The horizontal axis represents the ratio of the amount of Co, and the vertical axis represents the tensile stress used as the measure of evaluation of magnetism.

TABLE 1

| Ratio of amount of Co (at %) | Ratio of amount of Cr (at %) | Tensile stress (Pa) |
|---|---|---|
| 0 | 100 | 0.0 |
| 50 | 50 | 0.0 |
| 70 | 30 | 0.0 |
| 75 | 25 | 1.1 |
| 76 | 24 | 11.2 |
| 77 | 23 | 26.2 |
| 78 | 22 | 44.6 |
| 79 | 21 | 54.6 |
| 80 | 20 | 79.5 |
| 81 | 19 | 110.4 |
| 82 | 18 | 147.4 |
| 83 | 17 | 165.3 |
| 85 | 15 | 169.9 |
| 87 | 13 | 164.1 |
| 90 | 10 | 172.4 |
| 100 | 0 | 172.8 |

Table 1 and FIG. 1 show that the magnetism of the Co—Cr alloy is substantially zero when the Cr content ratio is 25 at % or more (the Co content ratio is 75 at % or less) in the Co—Cr alloy. In the non-magnetic metal phase in the first and second aspects of the target for magnetron sputtering according to the present invention, the atomic ratio of metal Cr to the total of metal Co and metal Cr is 25 at % or more and less than 100 at %, which makes magnetism of the non-magnetic metal phase substantially zero.

Table 1 and FIG. 1 also show that when the Cr content ratio is below 25 at % (when the Co content ratio exceeds 75 at %), the magnetism begins to increase drastically; when the Cr content ratio is 17 at % or less (the Co content ratio is 83 at % or more), a lower Cr content ratio (larger Co content ratio) even results in a moderate increase of the magnetism to keep the magnetism substantially constant. Therefore, in the magnetic metal phases containing Co and Cr, even the Co content ratio exceeding 83 at % hardly increases the magnetism as compared to the case where the Co content ratio is 83 at %.

Therefore, the content ratio of Co to the total of Co and Cr is preferably larger in the magnetic metal phases containing Co and Cr. As the Co content ratio is larger in the magnetic metal phases containing Co and Cr, the Co content ratio in the other metal phase can be reduced to make the other metal phase non-magnetic. This can thus reduce the volume fraction of the magnetic metal phase to increase the volume fraction of the non-magnetic metal phase and accordingly to decrease the magnetism of the entire target with a constant Co content in the entire target (without changing the content ratios of respective constituent elements contained in the target).

Specifically, the content ratio of Co to the total of Co and Cr is preferably 85 at % or more in the magnetic metal phase containing Co and Cr. When the content ratio of Co to the total of Co and Cr is 85 at % or more in the magnetic metal phase, a larger Co content ratio (Co content ratio closer to 100 at %) in the magnetic metal phases can lead to a lower Co content ratio in the other metal phase to make the other metal phase non-magnetic, with a constant Co content in the entire target (without changing the content ratios of respective constituent elements contained in the target). Therefore, the Co content ratio closer to 100 at % in the magnetic metal phases can lead to a lower volume fraction of the magnetic metal phase containing Co and Cr and accordingly a larger volume fraction of the non-magnetic metal phase, whereby the magnetism of the entire target can be reduced.

As described above, the present invention can reduce the volume fraction of the magnetic metal phase and increase the volume fraction of the non-magnetic metal phase to thereby decrease the magnetism of the entire target with a constant Co content in the entire target (without changing the content ratios of respective constituent elements contained in the target). Thus, particularly large effects can be obtained by applying the present invention to targets having a large metal Co content (a small metal Cr content) in the entire targets (for example, targets for magnetron sputtering that have an atomic ratio of metal Cr to the total of metal Co and the metal Cr of less than 20 at %).

Table 1 and FIG. 1 also show that the magnetism of the non-magnetic metal phase can be substantially zero when the atomic ratio of metal Cr to the total of metal Co and metal Cr is 30 at % or more. Thus, the atomic ratio of metal Cr to the total of metal Co and metal Cr is preferably 30 at % or more in the non-magnetic metal phase in the first and second aspects of the target for magnetron sputtering according to the present invention.

The data in TABLE 1 and FIG. 1 were measured as follows specifically. Co and Cr were prepared in a volume of 1 cm$^3$ and arc-melted to produce disk-shaped samples having a bottom area of 0.785 cm$^2$ with different compositions. The bottom surface of one of the disk-shaped samples was attached to a magnet (formed of ferrite) having a residual magnetic flux density of 500 Gauss. Then the sample was pulled in a direction perpendicular to the bottom surface, and a force when the sample was detached from the magnet was measured. Since a tensile stress determined by dividing the measured force by the bottom surface area 0.785 cm$^2$ is positively correlated with the magnetism of the sample, the tensile stress was used as the measure for evaluation of magnetism. Table 1 describes the values of the tensile stress as a function of the composition ratio. In the graph of FIG. 1, the tensile stress is taken along the vertical axis, and the Co content ratio is taken along the horizontal axis.

Next, third and fourth aspects of the target for magnetron sputtering according to the present invention will be described.

A third aspect of a target for magnetron sputtering according to the present invention is a target for magnetron sputtering, comprising metal Co, metal Cr, and an oxide with an atomic ratio of the metal Cr to the total of the metal Co and the metal Cr being more than 0 at % and less than 25 at %, wherein the target comprises: a non-magnetic metal phase containing metal Co and metal Cr with an atomic ratio of the metal Cr to the total of the metal Co and the metal Cr being 25 at % or more and less than 100 at % and with an atomic ratio of the metal Co to the total of the metal Co and the other metals being more than 0 at % and 45 at % or less; and a magnetic metal phase containing metal Co, wherein a volume ratio of the oxide to the non-magnetic metal phase is more than 0 and 1.2 or less, and wherein the non-magnetic metal phase and the oxide are mutually dispersed.

A fourth aspect of a target for magnetron sputtering according to the present invention is a target for magnetron sputtering, comprising metal Co, metal Cr, metal Pt, and an oxide with an atomic ratio of the metal Cr to the total of the metal Co and the metal Cr being more than 0 at % and less than 25 at %, wherein the target comprises: a non-magnetic metal phase containing metal Co, metal Cr, and metal Pt with an atomic ratio of the metal Cr to the total of the metal Co and the metal Cr being 25 at % or more and less than 100 at % and with an atomic ratio of the metal Co to the total of the metal Co and the other metals being more than 0 at % and 45 at % or less; and a magnetic metal phase containing metal Co, wherein a volume ratio of the oxide to the non-magnetic metal phase is more than 0 and 1.2 or less, and wherein the non-magnetic metal phase and the oxide are mutually dispersed.

The non-magnetic metal phase in the third and fourth aspects of the target for magnetron sputtering according to the present invention is the same as those in the first and second aspects in that the atomic ratio of metal Cr to the total of metal Co and metal Cr is 25 at % or more and less than 100 at %. The non-magnetic metal phase in the third and fourth aspects, however, has an additional constituent feature that the atomic ratio of metal Co to the total of the metal Co and the other metals is more than 0 at % and 70 at % or less. As demonstrated in [Examples] described below, the non-magnetic metal powder is easily mixed well with the oxide powder to substantially prevent aggregated oxides in the obtained target when the atomic ratio of metal Co to the total of the metal Co and the other metals is 70 at % or less in the non-magnetic metal powder constituting a powder mixture for target production.

The atomic ratio of metal Co to the total of the metal Co and the other metals is preferably 50 at % or less in the non-magnetic metal powder constituting a powder mixture for target production in order to decrease the possibility of presence of aggregated oxides in the obtained target and to reduce the number and size of the aggregated oxides if present.

The third and fourth aspects of the target for magnetron sputtering according to the present invention also have the same constituent feature as in the first and second aspects that the volume ratio of the oxide to the non-magnetic metal phase is more than 0 and 1.2 or less. Because of this, the volume ratio of the oxide powder to the non-magnetic metal powder is as small as more than 0 and 1.2 or less in terms of the non-magnetic metal powder and oxide powder that constitute a powder mixture for target production. This volume ratio facilitates good mixing of the non-magnetic metal powder and the oxide powder in the production of the powder mixture for target production (too much volume of the oxide powder to the non-magnetic metal powder easily causes poor mixing of the non-magnetic metal powder and the oxide powder).

As mentioned above, in both the third and fourth aspects of the target for magnetron sputtering according to the present invention, the non-magnetic metal phase and the oxide can be mutually dispersed, and thus the non-magnetic metal phase and the oxide easily form a structure in which they are finely dispersed in each other. That is, aggregation of the oxides can be substantially prevented in the target.

Next, a Co—Cr—Pt—$SiO_2$—$Cr_2O_3$ target, which can be preferably used for preparing a magnetic recording layer, will be specifically described below as an example of embodiment of the present invention. Although the non-magnetic metal phase in the target of this embodiment contains Pt, Pt in the non-magnetic metal phase is not essential and Pt may not be contained in the non-magnetic metal phase.

The components of target 10 for magnetron sputtering according to this embodiment (hereafter may be referred to as target 10) are Co—Cr—Pt—$SiO_2$—$Cr_2O_3$, but target 10 may contain other metals (for example, Cr, Pt, Au, Ag, Ru, Rh, Pd, Ir, W, Ta, Cu, B, Mo, etc.) unless they interfere with formation of a magnetic recording layer.

Figure 2:
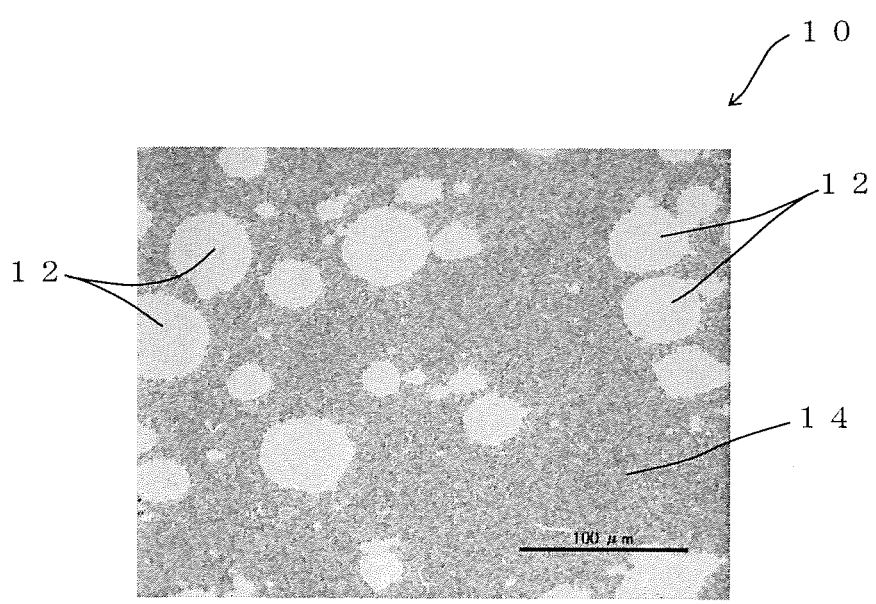
FIG. 2 is a metallurgical microscope photograph showing an example of the microstructure of a target according to an embodiment.

FIG. 2 shows a metallurgical microscope photograph of the cross section of an example of target for magnetron sputtering according to an embodiment of the present invention. FIG. 2 is a metallurgical microscope photograph of the cross section of a sintered product prepared in Example 1, and this figure is illustrated only for description of the structure of the target 10 according to this embodiment for convenience. The target of this embodiment is not limited to Example 1, and also the composition described here may not correspond to an actual composition in Example 1 of the phases designated as reference signs.

1. Constituent Components of Target

The constituent components of the target according to this embodiment are Co—Cr—Pt—$SiO_2$—$Cr_2O_3$. Co, Cr, and Pt are the constituent components forming magnetic particles (fine magnets) in a granular structure in a magnetic recording layer formed by sputtering. The oxides ($SiO_2$ and $Cr_2O_3$) form a non-magnetic matrix that separates the magnetic particles (fine magnets) in the granular structure from each other.

The ratio of the amounts of the metals (Co, Cr, and Pt) and the ratio of the amounts of the oxides ($SiO_2$ and $Cr_2O_3$) with respect to the total amount of the target are determined according to the intended composition of the magnetic recording layer. The ratio of the amounts of the metals (Co, Cr, and Pt) with respect to the total amount of the target is, for example, 88 mol % or more and 94 mol % or less, and the ratio of the amounts of the oxides ($SiO_2$ and $Cr_2O_3$) with respect to the total amount of the target is, for example, 6 mol % or more and 12 mol % or less.

Co is a ferromagnetic metal element and plays a central role in the formation of the magnetic particles (fine magnets) in the granular structure of the magnetic recording layer. The ratio of the amount of Co in the target with respect to the total amount of the metals (Co, Cr, and Pt) is, for example, 60 at % or more and 80 at % or less.

Since the target for magnetron sputtering according to this embodiment has ferromagnetic metal element Co, the target has characteristics of not only being used for preparing magnetic recording media but also easy formation of recording layers (magnetic layers) having large coercive force. These characteristics make the target suitable for hard disk manufacture.

Cr has a function of reducing the magnetic moment of Co when alloyed with Co within a prescribed composition range and plays a role in controlling the strength of the magnetism of the magnetic particles. The ratio of the amount of Cr in the target with respect to the total amount of the metals (Co, Cr, and Pt) is, for example, 4 at % or more and less than 25 at %.

Pt has a function of increasing the magnetic moment of Co when alloyed with Co within a prescribed composition range and plays a role in controlling the strength of the magnetism of the magnetic particles. The ratio of the amount of Pt in the target with respect to the total amount of the metals (Co, Cr, and Pt) is, for example, 1 at % or more and 22 at % or less.

In this embodiment, $SiO_2$ and $Cr_2O_3$ are used as the oxides, but the oxides used are not limited to $SiO_2$ and $Cr_2O_3$. For example, at least one oxide selected from $SiO_2$, $TiO_2$, $Ti_2O_3$, $Ta_2O_5$, $Cr_2O_3$, CoO, $Co_3O_4$, $B_2O_3$, $Fe_2O_3$, CuO, $Y_2O_3$, MgO, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$ may be used.

2. Microstructure of Target

As illustrated in FIG. 2 (metallurgical microscope photograph of the cross section in the thickness direction of the target according to Example 1), the target 10 according to this embodiment has a microstructure in which magnetic metal phases 12 containing metal Co and a matrix phase 14 (a phase where the non-magnetic metal phase (the atomic ratio of metal Cr to the total of metal Co and metal Cr is 25 at % or more and less than 100 at %) and the oxide are finely dispersed in each other) are mutually dispersed. In this embodiment, the magnetic metal phases 12 containing metal Co may be a Co single phase having a Co content ratio of 100 at %, and the magnetic metal phases 12 containing metal Co include a Co single phase having a Co content ratio of 100 at %.

In FIG. 2, the magnetic metal phase 12 is a large white phase having an approximately circular shape, and the matrix phase 14 is a gray phase.

In order for the entire target 10 to have a composition in which the atomic ratio of metal Cr to the total of metal Co and metal Cr is more than 0 at % and less than 25 at %, and for the non-magnetic metal phase in the matrix phase 14 to have a composition in which the atomic ratio of metal Cr to the total of metal Co and metal Cr is 25 at % or more and less than 100 at %, the magnetic metal phases 12 may be provided which have a larger content ratio of metal Co than the content ratio of metal Co in the composition of the entire target 10 by a certain degree. That is, the idea that more metal Co contained in the magnetic metal phases 12 allows smaller content ratio of metal Co in the non-magnetic metal phase in the matrix phase 14 (such that the atomic ratio of metal Cr to the total of metal Co and metal Cr is 25 at % or more) may be adopted. Adopting this idea can achieve substantially zero magnetism of the non-magnetic metal phase in the matrix phase 14 with a constant content of metal Co in the entire target 10 and thus can reduce the magnetism of the entire target 10 to increase the leakage magnetic flux from the surface of the target 10.

The increased volume fraction of the non-magnetic metal phase to the entire target 10 with a constant composition of the entire target 10 reduces the volume fraction of magnetic metal phases 12 to increase the Co content ratio in the magnetic metal phases 12. As mentioned above, however, the magnetism of the Co—Cr alloy becomes the same level as the magnetism of Co alone when the Co content ratio is, for example, 85 at % or more, and the magnetism of the Co—Cr alloy remains the same level even if the Co content ratio is further increased. Therefore, it is considered that when the Co content ratio of the magnetic metal phases 12 increases to a predetermined value or more, a further increase in the Co content ratio of the magnetic metal phases 12 may not lead to a significant increase in the magnetism of the magnetic metal phases 12. Even when the Co content ratio of the magnetic metal phases 12 increases, the magnetism as the entire target 10 can be weakened by increasing the volume fraction of the non-magnetic metal phase to the entire target 10 to reduce the volume fraction of the magnetic metal phases 12 to the entire target 10.

In the target 10 for magnetron sputtering according to this embodiment, the volume ratio of the oxides in the matrix phase 14 to the non-magnetic metal phase in the matrix phase 14 is more than 0 and 1.2 or less, and the volume ratio of the oxides in the matrix phase 14 to the non-magnetic metal phase in the matrix phase 14 is a predetermined value or less. In the matrix phase 14 of the target 10 for magnetron sputtering according to this embodiment, the oxides and the non-magnetic metal phase can be finely dispersed in each other, whereby aggregated oxides having a longest diameter of 5 μm or larger can be prevented from being present in the target 10. Defects such as nodules and particles is thus unlikely to occur during sputtering using the target 10 for magnetron sputtering according to this embodiment. When the volume ratio of the oxides in the matrix phase 14 to the non-magnetic metal phase in the matrix phase 14 exceeds 1.2, the volume of the oxide powder in a powder mixture for sintering for preparing the target is too large with respect to the volume of the metal powder. This imposes a risk of difficulty in sufficient mixing of the oxide powder with the metal powder (i.e., a risk of difficulty in fine dispersion between the oxides and the non-magnetic metal phase in the obtained target) and thus may cause defects such as large aggregation of the oxides in the obtained target.

Furthermore, in the target 10 for magnetron sputtering according to this embodiment, the atomic ratio of metal Co to the total of the metal Co and the other metals (all metals in the matrix phase 14) is more than 0 at % and 70 at % or less. As demonstrated in [Examples] described below, the non-magnetic metal powder is easily mixed well with the oxide powder to substantially prevent aggregation of the oxides in the obtained target when the atomic ratio of metal Co to the total of the metal Co and the other metals is 70 at % or less in the non-magnetic metal powder constituting a powder mixture for target production. This reason is not clear at present but, as demonstrated in Examples 1 to 6, the non-magnetic metal powder is easily mixed well with the oxide powder to substantially prevent aggregation of the oxides in the obtained target when the atomic ratio of metal Co to the total of the metal Co and the other metals is 70 at % or less in the non-magnetic metal powder constituting a powder mixture for target production.

To achieve better mixing of the non-magnetic metal powder and the oxide powder, the atomic ratio of metal Co to the total of the metal Co and the other metals is preferably 50 at % or less in the non-magnetic metal powder constituting the powder mixture for target production.

Since more elongated magnetic metal phase 12 (larger aspect ratio of the magnetic metal phase 12) containing Co tends to result in lower average leakage magnetic flux of the target 10, although the reason is not clear at present, the volume ratio of the magnetic metal phase 12 having an aspect ratio of 2 or more to the total magnetic metal phase 12 is preferably 0.5 or less in order to further increase the average leakage magnetic flux of the target 10.

3. Manufacturing Method for Target

The target 10 according to this embodiment can be produced, for example, in the following manner. Here, the manufacturing method when the magnetic metal phase 12 is a Co single phase will be described.

(1) Production of Non-Magnetic Metal Powder

Co and Cr are weighed to obtain a predetermined composition (the atomic ratio of metal Cr to the total of metal Co and the metal Cr is 25 at % or more and less than 100 at %) and a predetermined amount of Pt to be added is also weighed to produce a molten alloy. Subsequently, gas atomization is performed to produce Co—Cr—Pt alloy atomized non-magnetic powder with a predetermined composition (the atomic ratio of metal Cr to the total of metal Co and the metal Cr is 25 at % or more and less than 100 at %). The produced Co—Cr—Pt alloy atomized non-magnetic powder is subjected to size classification to obtain a predetermined particle size or smaller (for example, 106 μm or smaller).

To achieve substantially zero magnetism of the Co—Cr—Pt alloy atomized non-magnetic powder, the atomic ratio of metal Cr to the total of metal Co and the metal Cr contained in the powder is preferably 30 at % or more and less than 100 at %.

(1) Production of Non-Magnetic Powder Mixture

The produced Co—Cr—Pt alloy atomized non-magnetic powder after size classification and oxide powders ($SiO_2$ powder, $Cr_2O_3$ powder) are weighed so that the volume ratio of the oxide powders ($SiO_2$ powder, $Cr_2O_3$ powder) to the Co—Cr—Pt alloy atomized non-magnetic metal powder is more than 0 and 1.2 or less, followed by mixing dispersion to produce a non-magnetic powder mixture. The oxide powders ($SiO_2$ powder, $Cr_2O_3$ powder) form secondary particles of aggregated fine primary particles, and the mixing dispersion is performed until the Co—Cr—Pt alloy atomized non-magnetic powder and the oxide powders ($SiO_2$ powder, $Cr_2O_3$ powder) are finely dispersed well in each other (for example, the mixing dispersion of the Co—Cr—Pt alloy atomized non-magnetic powder and the oxide powders is performed with a ball mill up to the cumulative revolution number of 2,000,000 or more).

The Co—Cr—Pt alloy atomized non-magnetic metal powder and the oxide powders ($SiO_2$ powder, $Cr_2O_3$ powder) are easily mixed well when the volume ratio of the oxide powders ($SiO_2$ powder, $Cr_2O_3$ powder) to the Co—Cr—Pt alloy atomized non-magnetic metal powder is 1.2 or less.

(3) Production of Powder Mixture for Pressure Sintering

The non-magnetic powder mixture produced in (2) and Co single powder are mixed and dispersed with each other to obtain an approximately uniform mixture, whereby a powder mixture for pressure sintering is produced. The mixing dispersion in this step is completed before the particle size of the Co single powder becomes smaller. This is because the mixing dispersion until the particle size of the Co single powder becomes smaller may reduce the leakage magnetic flux of the obtained target, although the reason is not clear at present.

Therefore, it is preferable not to provide the step of mixing and dispersing the Co single powder (magnetic metal powder) with the oxide powders with a ball mill.

(4) Molding

The powder mixture for pressure sintering produced in (3) is pressure-sintered and molded using, for example, a vacuum hot press method to produce a target.

(5) Characteristics of Manufacturing Method

The manufacturing method according to this embodiment is characterized in that the non-magnetic powder mixture is obtained by weighing the non-magnetic metal powder produced in (1) and the oxide powders so that the volume ratio of the oxide powders to the non-magnetic metal powder is more than 0 and 1.2 or less as described in (2), followed by mixing dispersion until they are finely dispersed well in each other. Since the non-magnetic metal powder and the oxide powders are weighed so that the volume ratio of the oxide powders to the non-magnetic metal powder is 1.2 or less followed by mixing dispersion, a non-magnetic powder mixture in which the non-magnetic metal powder and the oxide powders are mutually mixed well is obtained.

The target is produced by pressure sintering using the non-magnetic powder mixture in which the non-magnetic metal powder and the oxide powders are mutually mixed well. This allows the matrix phase 14 in the obtained target to have a structure in which the non-magnetic metal phase and the oxides are finely dispersed in each other even if the mixing dispersion of the non-magnetic powder mixture produced in (2) and Co single powder is stopped before the particle size of the Co single powder becomes smaller in the production of a powder mixture for pressure sintering. Thus, the target 10 for magnetron sputtering according to this embodiment has a structure in which the magnetic metal phases 12 are dispersed in the matrix phase 14 where the non-magnetic metal phase and the oxides are finely dispersed in each other. This structure prevents aggregation of the oxides from being generated in the target.

Therefore, defects such as generation of nodules and particles are unlikely to occur during sputtering using the target obtained by this manufacturing method.

EXAMPLES

Example 1

The overall composition of a target prepared in Example 1 was 90(71Co-10Cr-14Pt-5Ru)-7$SiO_2$-3$Cr_2O_3$, and the target was prepared and evaluated as follows.

Each metal was weighed so that the alloy composition was Co: 44.586 at %, Cr: 19.108 at %, Pt: 26.752 at %, and Ru: 9.554 at %, and they are heated to 1700° C. to provide a molten alloy. Gas atomization was then performed to prepare 44.586Co-19.108Cr-26.752Pt-9.554Ru alloy powder (non-magnetic metal powder). The atomic ratio of metal Cr to the total of metal Co and metal Cr that are contained in the 44.586Co-19.108Cr-26.752Pt-9.554Ru alloy powder (non-magnetic metal powder) is 30 at %.

Co alone was heated to 1,700° C. to obtain molten Co, and the molten Co was gas-atomized to prepare a Co powder (magnetic metal powder).

The prepared two atomized metal powders (44.586Co-19.108Cr-26.752Pt-9.554Ru alloy powder and Co powder) were separately classified through 150 mesh sieves to obtain two atomized metal powders (44.586Co-19.108Cr-26.752Pt-9.554Ru alloy powder and Co powder) having a particle diameter of ϕ106 μm or smaller.

The Co powder was further classified through a 325 mesh sieve to obtain an atomized metal powder having a particle size of 45 μm or larger and 106 μm or smaller.

To 630.36 g of the classified 44.586Co-19.108Cr-26.752Pt-9.554Ru alloy powder, 57.40 g of a $SiO_2$ powder and 62.24 g of a $Cr_2O_3$ powder were added. Then, the mixture was mixed and dispersed by a ball mill to obtain a non-magnetic powder mixture. The cumulative rotation number of a ball mill was 2,988,000.

Next, 650.64 g of the obtained non-magnetic powder mixture and 299.36 g of the classified metal Co powder (the magnetic metal powder) were mixed by a Turbula shaker under conditions of 67 rpm and 30 min to obtain a powder mixture for pressure sintering.

The volume ratio of the 44.586Co-19.108Cr-26.752Pt-9.554Ru alloy powder (non-magnetic metal powder) to the obtained entire powder mixture for pressure sintering is 38.7 vol %, the volume ratio of the oxide powders (the total of $SiO_2$ powder and $Cr_2O_3$ powder) thereto is 30.4 vol %, and the volume ratio of metal Co powder (magnetic metal powder) thereto is 30.9 vol %. Therefore, the volume ratio of the oxide powders (the total of $SiO_2$ powder and $Cr_2O_3$ powder) to the 44.586Co-19.108Cr-26.752Pt-9.554Ru alloy powder (non-magnetic metal powder) is as small as 0.786. It is thus considered that the 44.586Co-19.108Cr-26.752Pt-9.554Ru alloy powder (non-magnetic metal powder) may be easily mixed well with the oxide powders.

The obtained powder mixture (30 g) for pressure sintering was subjected to hot pressing under the conditions of sintering temperature: 1190° C., pressure: 31 MPa, time: 30 min, and atmosphere: $5\times10^{-2}$ Pa or lower to prepare a sintered test piece (φ30 mm). The relative density of the prepared sintered test piece was 96.801%. The calculated density is 8.74 g/cm$^3$.

Figure 3:
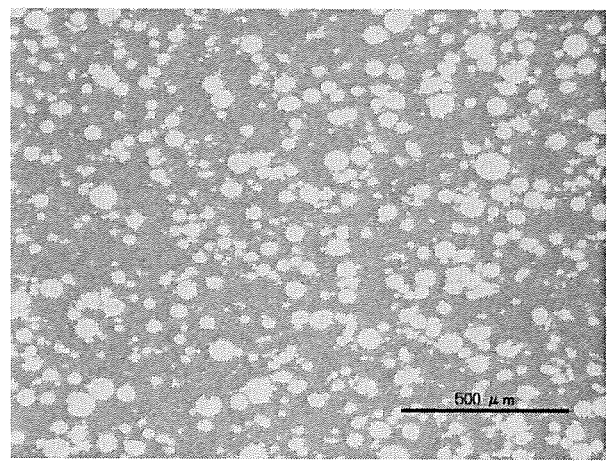
FIG. 3 is a metallurgical microscope photograph of the cross section in the thickness direction of a sintered test piece according to Example 1 at low magnification (an image taken at a magnification of 100×; a bar scale in the photograph represents 500 μm).
Figure 4:
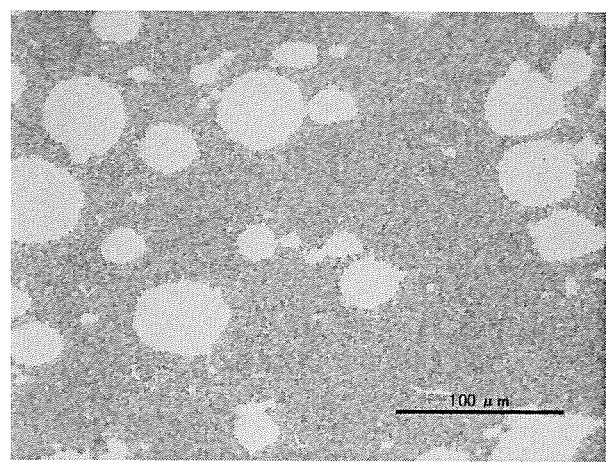
FIG. 4 is a metallurgical microscope photograph of the cross section in the thickness direction of a sintered test piece according to Example 1 at high magnification (an image taken at a magnification of 500×; a bar scale in the photograph represents 100 μm).

FIG. 3 and FIG. 4 are metallurgical microscope photograph of the cross section in the thickness direction of the obtained sintered test piece. FIG. 3 is a photograph at a photographing magnification of 100 times (a bar scale in the photograph represents 500 μm), and FIG. 4 is a photograph at a photographing magnification of 500 times (a bar scale in the photograph represents 100 μm).

In FIGS. 3 and 4, the gray phase is a non-magnetic phase in which the 44.586Co-19.108Cr-26.752Pt-9.554Ru alloy phase (non-magnetic metal phase) and the oxides ($SiO_2$, $Cr_2O_3$) are finely dispersed in each other, and the approximate circular white phases dispersed in this non-magnetic phase are Co phases (magnetic metal phases). Since the 44.586Co-19.108Cr-26.752Pt-9.554Ru alloy powder had been mixed with the oxide powders with a ball mill up to the cumulative revolution number of 2,988,000, it is considered that the 44.586Co-19.108Cr-26.752Pt-9.554Ru alloy phase and the oxide phase are finely dispersed in each other and this dispersion may be accordingly observed as the gray single phase in the metallurgical microscope photographs of FIGS. 3 and 4. On the other hand, it is considered that the Co powder maintains the approximately spherical shape because of lack of mixing with a ball mill.

If aggregated oxides are present in the sintered test piece, they should be observed as black phases. In FIGS. 3 and 4, however, no black phases are observed. Thus, no aggregated oxides having a longest diameter of 5 μm or larger are considered to be present in the sintered test piece obtained in this Example 1.

Next, the prepared powder mixture for pressure sintering was subjected to a hot press under the conditions of sintering temperature: 1190° C., pressure: 31 MPa, time: 60 min, and atmosphere: $5\times10^{-2}$ Pa or lower to prepare a target with φ152.4 mm and a thickness of 5.0 mm. The relative density of the prepared target was 98.430%.

The leakage magnetic flux from the prepared target was evaluated according to ASTM F2086-01. A horseshoe-shaped magnet (formed of alnico) was used to generate the magnetic flux. This magnet was attached to an apparatus for measuring the leakage magnetic flux, and a gauss meter was connected to a hole probe. The hole probe was disposed so as to be positioned directly above the center between the magnetic poles of the horseshoe-shaped magnet.

First, a magnetic flux density of the horizontal direction on the surface of a table of the measuring apparatus was measured with no target placed on the surface of the table to measure a source field defined by ASTM. The source field was 891 (G).

Next, the tip of the hole probe was raised to the position at which the leakage magnetic flux from a target was measured (a position at a height of (the thickness of the target+2 mm) from the surface of the table), and a leakage magnetic flux density in a direction horizontal to the surface of the table was measured with no target placed on the surface of the table to measure a reference field defined by ASTM. The reference field was 614 (G).

Then a target was placed on the surface of the table such that the distance between the center of the surface of the target and a point on the target surface directly below the hole probe was 43.7 mm. The target was rotated 5 turns in an anticlockwise direction without moving its central position and then rotated by 0°, 30°, 60°, 90°, and 120° without moving the central position to measure the leakage magnetic flux density in a direction horizontal to the table surface at each of these rotated positions. The obtained five leakage magnetic flux density values were divided by the value of the reference field and multiplied by 100 to obtain leakage magnetic flux ratios (%). The five leakage magnetic flux ratios (%) were averaged, and the average value was used as the average leakage magnetic flux ratio (%) of the target. As shown in TABLE 2 below, the average leakage magnetic flux ratio of the prepared target was 70.0%.

TABLE 2

| | Source Field(G) | Reference Field(G) | Leakage magnetic flux density(G) | Leakage magnetic flux ratio(%) |
|---|---|---|---|---|
| 0° | 891 | 614 | 430 | 70.0 |
| 30° | 891 | 614 | 430 | 70.0 |
| 60° | 891 | 614 | 430 | 70.0 |
| 90° | 891 | 614 | 430 | 70.0 |
| 120° | 891 | 614 | 430 | 70.0 |
| Average leakage magnetic flux ratio(%) | | | | 70.0 |

Example 2

The composition of the entire target prepared as Example 2 is 90(71Co-10Cr-14Pt-5Ru)-7SiO$_2$-3Cr$_2$O$_3$, which is the same as that in Example 1. Meanwhile, Co—Cr—Pt—Ru alloy powder of two types of atomized metal powders prepared (Co—Cr—Pt—Ru alloy powder, Co powder) has a composition of 39.038Co-21.021Cr-29.430Pt-10.511Ru and is non-magnetic. Furthermore, the Co content ratio is smaller than that in Example 1. The atomic ratio of metal Cr to the total of metal Co and metal Cr that are contained in the 39.038Co-21.021Cr-29.430Pt-10.511Ru alloy powder (non-magnetic metal powder) is 35 at.

In this Example 2, the volume of Co powder (the mass ratio of Co powder to Co—Cr—Pt—Ru alloy powder) used is larger than that in Example 1 as the Co content ratio of the Co—Cr—Pt—Ru alloy powder is smaller than that in Example 1. Thus the composition of the entire target is the same as that in Example 1.

The target in the present Example 2 was prepared and evaluated as follows.

Atomization and size classification were performed in the same manner as in Example 1 except that the composition of the prepared Co—Cr—Pt—Ru alloy powder was 39.038Co-21.021Cr-29.430Pt-10.511Ru, thereby obtaining 39.038Co-21.021Cr-29.430Pt-10.511Ru alloy powder (particle size: 106 μm or smaller) and Co powder (particle size: 45 to 106 μm).

To 599.62 g of the obtained 39.038Co-21.021Cr-29.430Pt-10.511Ru alloy powder, 57.76 g of a SiO$_2$ powder and 62.62 g of a Cr$_2$O$_3$ powder were added. Then, the mixture was mixed and dispersed by a ball mill (with the cumulative number of ball mill revolutions of 2,988,000) to obtain a non-magnetic powder mixture.

Next, 620.73 g of the obtained non-magnetic powder mixture and 329.27 g of the classified Co powder (the magnetic metal powder) were mixed by a Turbula shaker under conditions of 67 rpm and 30 min to obtain a powder mixture for pressure sintering.

The volume ratio of the 39.038Co-21.021Cr-29.430Pt-10.511Ru alloy powder (non-magnetic metal powder) to the obtained entire powder mixture for pressure sintering is 35.6 vol %, the volume ratio of the oxide powders (the total of $SiO_2$ powder and $Cr_2O_3$ powder) thereto is 30.4 vol %, and the volume ratio of metal Co powder (magnetic metal powder) thereto is 34.0 vol %. Therefore, the volume ratio of the oxide powders (the total of $SiO_2$ powder and $Cr_2O_3$ powder) to the 39.038Co-21.021Cr-29.430Pt-10.511Ru alloy powder (non-magnetic metal powder) is as small as 0.854. It is thus considered that the 39.038Co-21.021Cr-29.430Pt-10.511Ru alloy powder (non-magnetic metal powder) may be easily mixed well with the oxide powders.

The obtained powder mixture (30 g) for pressure sintering was subjected to hot pressing under the conditions of sintering temperature: 1190° C., pressure: 31 MPa, time: 30 min, and atmosphere: $5 \times 10^{-2}$ Pa or lower to prepare a sintered test piece (φ30 mm). The relative density of the prepared sintered test piece was 96.672%. The calculated density, is 8.74 g/cm$^3$.

Figure 5:
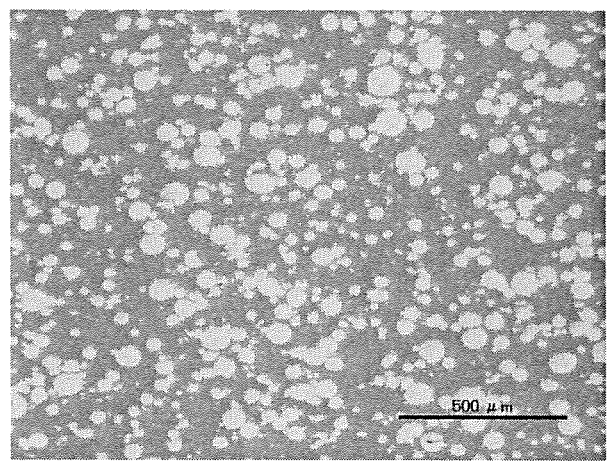
FIG. 5 is a metallurgical microscope photograph of the cross section in the thickness direction of a sintered test piece according to Example 2 at low magnification (an image taken at a magnification of 100×; a bar scale in the photograph represents 500 μm).
Figure 6:
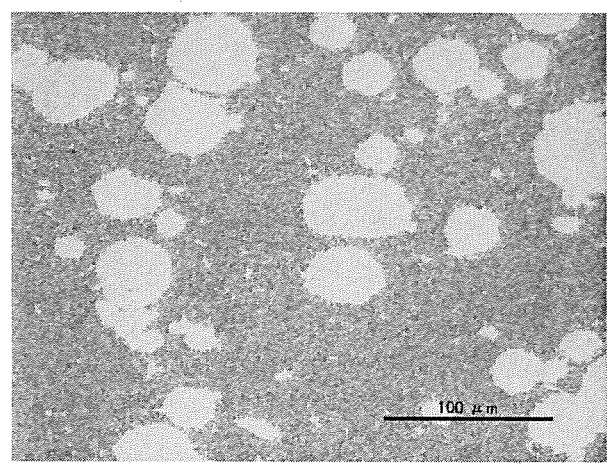
FIG. 6 is a metallurgical microscope photograph of the cross section in the thickness direction of a sintered test piece according to Example 2 at high magnification (an image taken at a magnification of 500×; a bar scale in the photograph represents 100 μm).

FIG. 5 and FIG. 6 are metallurgical microscope photograph of the cross section in the thickness direction of the obtained sintered test piece. FIG. 5 is a photograph at a photographing magnification of 100 times (a bar scale in the photograph represents 500 μm), and FIG. 6 is a photograph at a photographing magnification of 500 times (a bar scale in the photograph represents 100 μm).

In FIGS. 5 and 6, the gray phase is a non-magnetic phase in which the 39.038Co-21.021Cr-29.430Pt-10.511Ru alloy phase (non-magnetic metal phase) and the oxides ($SiO_2$, $Cr_2O_3$) are finely dispersed in each other, and the approximate circular white phases dispersed in this non-magnetic phase are Co phases (magnetic metal phases). Since the 39.038Co-21.021Cr-29.430Pt-10.511Ru alloy powder had been mixed with the oxide powders with a ball mill up to the cumulative revolution number of 2,988,000, it is considered that the 39.038Co-21.021Cr-29.430Pt-10.511Ru alloy phase and the oxide phase are finely dispersed in each other and this dispersion may be accordingly observed as the gray single phase in the metallurgical microscope photographs of FIGS. 5 and 6. On the other hand, it is considered that the Co powder maintains the approximately spherical shape because of lack of mixing with a ball mill.

If aggregated oxides are present in the sintered test piece, they should be observed as black phases. In FIGS. 5 and 6, however, black phases are hardly found and only small black spots are observed near the left side of FIG. 6. According to the scale at the lower right of FIG. 6, these small black spots near the left side of FIG. 6 can be determined to have a longest diameter of smaller than 5 μm. Thus, no aggregated oxides having a longest diameter of 5 μm or larger are considered to be present in the sintered test piece obtained in this Example 2.

Next, the prepared powder mixture for pressure sintering was subjected to a hot press under the conditions of sintering temperature: 1190° C., pressure: 31 MPa, time: 60 min, and atmosphere: $5 \times 10^{-2}$ Pa or lower to prepare a target with φ152.4 mm and a thickness of 5.0 mm. The relative density of the prepared target was 98.399%.

The leakage magnetic flux from the prepared target was evaluated as in Example 1. As shown in TABLE 3 below, the average leakage magnetic flux ratio was 72.2%.

TABLE 3

| | Source Field(G) | Reference Field(G) | Leakage magnetic flux density(G) | Leakage magnetic flux ratio(%) |
|---|---|---|---|---|
| 0° | 891 | 619 | 446 | 72.1 |
| 30° | 891 | 619 | 447 | 72.2 |
| 60° | 891 | 619 | 447 | 72.2 |
| 90° | 891 | 619 | 447 | 72.2 |
| 120° | 891 | 619 | 447 | 72.2 |
| Average leakage magnetic flux ratio(%) | | | | 72.2 |

Example 3

The composition of the entire target prepared as Example 3 is 90(71Co-10Cr-14Pt-5Ru)-7$SiO_2$-3$Cr_2O_3$, which is the same as that in Example 1 and 2. Meanwhile, Co—Cr—Pt—Ru alloy powder of two types of atomized metal powders prepared (Co—Cr—Pt—Ru alloy powder, Co powder) has a composition of 34.091Co-22.727Cr-31.818Pt-11.364Ru and is non-magnetic. Furthermore, the Co content ratio is smaller than that in Example 1 and 2. The atomic ratio of metal Cr to the total of metal Co and metal Cr that are contained in the 34.091Co-22.727Cr-31.818Pt-11.364Ru alloy powder (non-magnetic metal powder) is 40 at %.

In this Example 3, the volume of Co powder (the mass ratio of Co powder to Co—Cr—Pt—Ru alloy powder) used is larger than that in Example 1 and 2 as the Co content ratio of the Co—Cr—Pt—Ru alloy powder is smaller than that in Example 1 and 2. Thus the composition of the entire target is the same as that in Example 1 and 2.

The target in the present Example 3 was prepared and evaluated as follows.

Atomization and size classification were performed in the same manner as in Example 1 and 2 except that the composition of the Co—Cr—Pt—Ru alloy powder was 34.091Co-22.727Cr-31.818Pt-11.364Ru, thereby obtaining 34.091Co-22.727Cr-31.818Pt-11.364Ru alloy powder (particle size: 106 μm or smaller) and Co powder (particle size: 45 to 106 μm).

To 578.57 g of the obtained 34.091Co-22.727Cr-31.818Pt-11.364Ru alloy powder, 58.26 g of a $SiO_2$ powder and 63.17 g of a $Cr_2O_3$ powder were added. Then, the mixture was mixed and dispersed by a ball mill (with the cumulative number of ball mill revolutions of 2,988,000) to obtain a non-magnetic powder mixture.

Next, 598.30 g of the obtained non-magnetic powder mixture and 351.70 g of the classified Co powder (the magnetic metal powder) were mixed by a Turbula shaker under conditions of 67 rpm and 30 min to obtain a powder mixture for pressure sintering.

The volume ratio of the 34.091Co-22.727Cr-31.818Pt-11.364Ru alloy powder (non-magnetic metal powder) to the obtained entire powder mixture for pressure sintering is 33.3 vol %, the volume ratio of the oxide powders (the total of $SiO_2$ powder and $Cr_2O_3$ powder) thereto is 30.4 vol %, and the volume ratio of metal Co powder (magnetic metal powder) thereto is 36.3 vol %. Therefore, the volume ratio of the oxide powders (the total of $SiO_2$ powder and $Cr_2O_3$ powder) to the 34.091Co-22.727Cr-31.818Pt-11.364Ru alloy powder (non-magnetic metal powder) is as small as 0.913. It is thus considered that the 34.091Co-22.727Cr-31.818Pt-11.364Ru alloy powder (non-magnetic metal powder) may be easily mixed well with the oxide powders.

The obtained powder mixture (30 g) for pressure sintering was subjected to hot pressing under the conditions of sintering temperature: 1190° C., pressure: 31 MPa, time: 30 min, and atmosphere: 5×10$^{-2}$ Pa or lower to prepare a sintered test piece (ϕ30 mm). The relative density of the prepared sintered test piece was 97.430%. The calculated density is 8.74 g/cm$^3$.

Figure 7:
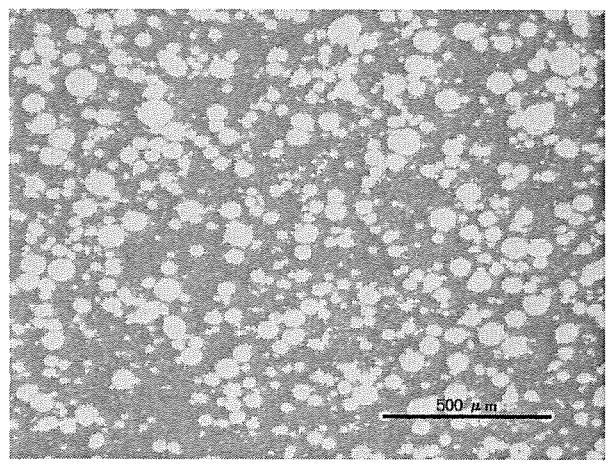
FIG. 7 is a metallurgical microscope photograph of the cross section in the thickness direction of a sintered test piece according to Example 3 at low magnification (an image taken at a magnification of 100×; a bar scale in the photograph represents 500 μm).
Figure 8:
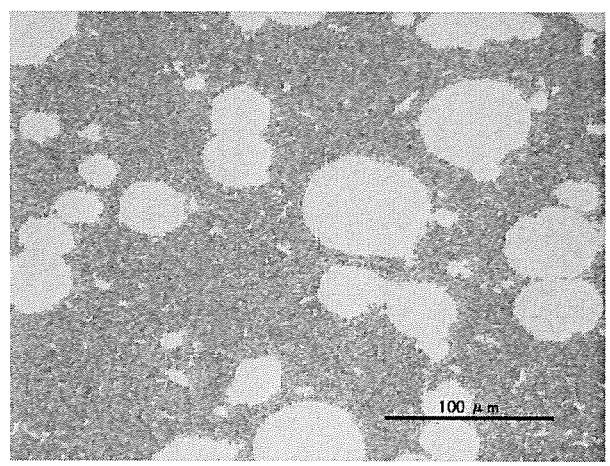
FIG. 8 is a metallurgical microscope photograph of the cross section in the thickness direction of a sintered test piece according to Example 3 at high magnification (an image taken at a magnification of 500×; a bar scale in the photograph represents 100 μm).

FIG. 7 and FIG. 8 are metallurgical microscope photograph of the cross section in the thickness direction of the obtained sintered test piece. FIG. 7 is a photograph at a photographing magnification of 100 times (a bar scale in the photograph represents 500 μm), and FIG. 8 is a photograph at a photographing magnification of 500 times (a bar scale in the photograph represents 100 μm).

In FIGS. 7 and 8, the gray phase is a non-magnetic phase in which the 34.091Co-22.727Cr-31.818Pt-11.364Ru alloy phase (non-magnetic metal phase) and the oxides (SiO$_2$, Cr$_2$O$_3$) are finely dispersed in each other, and the approximate circular white phases dispersed in this non-magnetic phase are Co phases (magnetic metal phases). Since the 34.091Co-22.727Cr-31.818Pt-11.364Ru alloy powder had been mixed with the oxide powders with a ball mill up to the cumulative revolution number of 2,988,000, it is considered that the 34.091Co-22.727Cr-31.818Pt-11.364Ru alloy phase and the oxide phase are finely dispersed in each other and this dispersion may be accordingly observed as the gray single phase in the metallurgical microscope photographs of FIGS. 7 and 8. On the other hand, it is considered that the Co powder maintains the approximately spherical shape because of lack of mixing with a ball mill.

If aggregated oxides are present in the sintered test piece, they should be observed as black phases. In FIGS. 7 and 8, however, no black phases are found. Thus, no aggregated oxides having a longest diameter of 5 μm or larger are considered to be present in the sintered test piece obtained in this Example 3.

Next, the prepared powder mixture for pressure sintering was subjected to a hot press under the conditions of sintering temperature: 1190° C., pressure: 31 MPa, time: 60 min, and atmosphere: 5×10$^{-2}$ Pa or lower to prepare a target with ϕ152.4 mm and a thickness of 5.0 mm. The relative density of the prepared target was 98.573%.

The leakage magnetic flux from the prepared target was evaluated as in Example 1. As shown in TABLE 4 below, the average leakage magnetic flux ratio was 73.4%.

TABLE 4

| | Source Field(G) | Reference Field(G) | Leakage magnetic flux density(G) | Leakage magnetic flux ratio(%) |
|---|---|---|---|---|
| 0° | 891 | 618 | 453 | 73.3 |
| 30° | 891 | 618 | 453 | 73.3 |
| 60° | 891 | 618 | 453 | 73.3 |
| 90° | 891 | 618 | 454 | 73.5 |
| 120° | 891 | 618 | 454 | 73.5 |
| Average leakage magnetic flux ratio(%) | | | | 73.4 |

Example 4

The composition of the entire target prepared as Example 4 is 90(71Co-10Cr-14Pt-5Ru)-7SiO$_2$-3Cr$_2$O$_3$, which is the same as that in Example 1 to 3. Meanwhile, Co—Cr—Pt—Ru alloy powder of two types of atomized metal powders prepared (Co—Cr—Pt—Ru alloy powder, Co powder) has a composition of 18.692Co-28.037Cr-39.252Pt-14.019Ru and is non-magnetic. Furthermore, the Co content ratio is smaller than that in Example 1 to 3. The atomic ratio of metal Cr to the total of metal Co and metal Cr that are contained in the 18.692Co-28.037Cr-39.252Pt-14.019Ru alloy powder (non-magnetic metal powder) is 60 at %.

In this Example 4, the volume of Co powder (the mass ratio of Co powder to Co—Cr—Pt—Ru alloy powder) used is larger than that in Example 1 to 3 as the Co content ratio of the Co—Cr—Pt—Ru alloy powder is smaller than that in Example 1 to 3. Thus the composition of the entire target is the same as that in Example 1 to 3.

The target in the present Example 4 was prepared and evaluated as follows.

Atomization and size classification were performed in the same manner as in Example 1 and 2 except that the composition of the Co—Cr—Pt—Ru alloy powder was 18.692Co-28.037Cr-39.252Pt-14.019Ru, thereby obtaining 18.692Co-28.037Cr-39.252Pt-14.019Ru alloy powder (particle size: 106 μm or smaller) and Co powder (particle size: 45 to 106 μm).

To 522.39 g of the obtained 18.692Co-28.037Cr-39.252Pt-14.019Ru alloy powder, 58.83 g of a SiO$_2$ powder and 63.78 g of a Cr$_2$O$_3$ powder were added. Then, the mixture was mixed and dispersed by a ball mill (with the cumulative number of ball mill revolutions of 2,988,000) to obtain a non-magnetic powder mixture.

Next, 545.97 g of the obtained non-magnetic powder mixture and 404.03 g of the classified Co powder (the magnetic metal powder) were mixed by a Turbula shaker under conditions of 67 rpm and 30 min to obtain a powder mixture for pressure sintering.

The volume ratio of the 18.692Co-28.037Cr-39.252Pt-14.019Ru alloy powder (non-magnetic metal powder) to the obtained entire powder mixture for pressure sintering is 27.9 volt, the volume ratio of the oxide powders (the total of SiO$_2$ powder and Cr$_2$O$_3$ powder) thereto is 30.3 volt, and the volume ratio of metal Co powder (magnetic metal powder) thereto is 41.8 vol %. Therefore, the volume ratio of the oxide powders (the total of SiO$_2$ powder and Cr$_2$O$_3$ powder) to the 18.692Co-28.037Cr-39.252Pt-14.019Ru alloy powder (non-magnetic metal powder) is as small as 1.086. It is thus considered that the 18.692Co-28.037Cr-39.252Pt-14.019Ru alloy powder (non-magnetic metal powder) may be easily mixed well with the oxide powders.

The obtained powder mixture (30 g) for pressure sintering was subjected to hot pressing under the conditions of sintering temperature: 1190° C., pressure: 31 MPa, time: 30 min, and atmosphere: 5×10$^{-2}$ Pa or lower to prepare a sintered test piece (ϕ30 mm). The relative density of the prepared sintered test piece was 97.528%. The calculated density is 8.74 g/cm$^3$.

Figure 9:
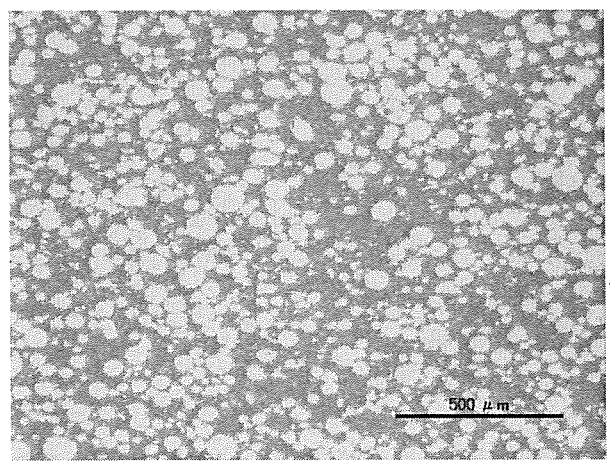
FIG. 9 is a metallurgical microscope photograph of the cross section in the thickness direction of a sintered test piece according to Example 4 at low magnification (an image taken at a magnification of 100×; a bar scale in the photograph represents 500 μm).
Figure 10:
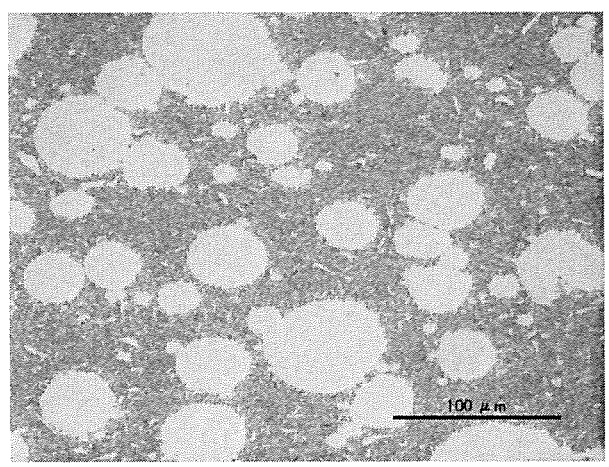
FIG. 10 is a metallurgical microscope photograph of the cross section in the thickness direction of a sintered test piece according to Example 4 at high magnification (an image taken at a magnification of 500×; a bar scale in the photograph represents 100 μm).

FIG. 9 and FIG. 10 are metallurgical microscope photograph of the cross section in the thickness direction of the obtained sintered test piece. FIG. 9 is a photograph at a photographing magnification of 100 times (a bar scale in the photograph represents 500 μm), and FIG. 10 is a photograph at a photographing magnification of 500 times (a bar scale in the photograph represents 100 μm).

In FIGS. 9 and 10, the gray phase is a non-magnetic phase in which the 18.692Co-28.037Cr-39.252Pt-14.019Ru alloy phase (non-magnetic metal phase) and the oxides (SiO$_2$, Cr$_2$O$_3$) are finely dispersed in each other, and the approximate circular white phases dispersed in this non-magnetic phase are Co phases (magnetic metal phases). Since the 18.692Co-28.037Cr-39.252Pt-14.019Ru alloy powder had been mixed with the oxide powders with a ball mill up to the cumulative revolution number of 2,988,000, it is considered that the 18.692Co-28.037Cr-39.252Pt-14.019Ru alloy phase and the oxide phase are finely dispersed in each other and this dispersion may be accordingly observed as the gray single phase in the metallurgical microscope photographs of FIGS. 9 and 10. On the other hand, it is considered that the Co powder maintains the approximately spherical shape because of lack of mixing with a ball mill.

If aggregated oxides are present in the sintered test piece, they should be observed as black phases. In FIGS. 9 and 10, however, black phases are hardly found and only small black spots are observed near the upper side of FIG. 10. According to the scale at the lower right of FIG. 10, these small black spots near the upper side of FIG. 10 can be determined to have a longest diameter of smaller than 5 μm. Thus, no aggregated oxides having a longest diameter of 5 μm or larger are considered to be present in the sintered test piece obtained in this Example 4.

Next, the prepared powder mixture for pressure sintering was subjected to a hot press under the conditions of sintering temperature: 1190° C., pressure: 31 MPa, time: 60 min, and atmosphere: $5 \times 10^{-2}$ Pa or lower to prepare a target with ϕ152.4 mm and a thickness of 5.0 mm. The relative density of the prepared target was 99.243%.

The leakage magnetic flux from the prepared target was evaluated as in Example 1. As shown in TABLE 5 below, the average leakage magnetic flux ratio was 74.7%.

TABLE 5

| Source Field(G) | Reference Field(G) | Leakage magnetic flux density(G) | Leakage magnetic flux ratio(%) |
|---|---|---|---|
| 0° | 884 | 625 | 467 | 74.7 |
| 30° | 884 | 625 | 467 | 74.7 |
| 60° | 884 | 625 | 466 | 74.6 |
| 90° | 884 | 625 | 467 | 74.7 |
| 120° | 884 | 625 | 467 | 74.7 |
| Average leakage magnetic flux ratio(%) | | | 74.7 |

Example 5

The composition of the entire target prepared as Example 5 is 90(71Co-10Cr-14Pt-5Ru)-7SiO$_2$-3Cr$_2$O$_3$, which is the same as that in Example 1 to 4. Meanwhile, Co—Cr—Pt—Ru alloy powder of two types of atomized metal powders prepared (Co—Cr—Pt—Ru alloy powder, Co powder) has a composition of 34.091Co-22.727Cr-31.818Pt-11.364Ru as in Example 3. The atomic ratio of metal Cr to the total of metal Co and metal Cr that are contained in the 34.091Co-22.727Cr-31.818Pt-11.364Ru alloy powder (non-magnetic metal powder) is 40 at %.

In Examples 1 to 4, the Co—Cr—Pt—Ru alloy powder is mixed and dispersed with the oxide powders with a ball mill, whereas the Co powder is not subjected to mixing dispersion with a ball mill. Meanwhile, in this Example 5, the Co powder is also mixed and dispersed with the oxide powders with a ball mill.

The target in the present Example 5 was prepared and evaluated as follows.

Atomization and size classification were performed in the same manner as in Example 1 to 4 except that the composition of the Co—Cr—Pt—Ru alloy powder was 34.091Co-22.727Cr-31.818Pt-11.364Ru, thereby obtaining 34.091Co-22.727Cr-31.818Pt-11.364Ru alloy powder (particle size: 106 μm or smaller) and Co powder (particle size: 45 to 106 μm).

To 1055.87 g of the obtained 34.091Co-22.727Cr-31.818Pt-11.364Ru alloy powder, 99.28 g of a SiO$_2$ powder and 107.60 g of a Cr$_2$O$_3$ powder were added. Then, the mixture was mixed and dispersed by a ball mill (with the cumulative number of ball mill revolutions of 2,988,000) to obtain a non-magnetic powder mixture.

The volume ratio of the 34.091Co-22.727Cr-31.818Pt-11.364Ru alloy powder (non-magnetic metal powder) to the obtained entire non-magnetic powder mixture is 54.0 vol %, the volume ratio of the oxide powders (the total of SiO$_2$ powder and Cr$_2$O$_3$ powder) thereto is 46.0 vol %. Therefore, the volume ratio of the oxide powders (the total of SiO$_2$ powder and Cr$_2$O$_3$ powder) to the 34.091Co-22.727Cr-31.818Pt-11.364Ru alloy powder (non-magnetic metal powder) is as small as 0.852. It is thus considered that the 34.091Co-22.727Cr-31.818Pt-11.364Ru alloy powder (non-magnetic metal powder) may be easily mixed well with the oxide powders.

To 882.57 g of the obtained Co powder, 8.20 g of a SiO$_2$ powder and 8.89 g of a Cr$_2$O$_3$ powder were added. Then, the mixture was mixed and dispersed by a ball mill (with the cumulative number of ball mill revolutions of 1,142,640) to obtain a magnetic powder mixture.

Next, 591.45 g of the obtained non-magnetic powder mixture and 358.56 g of the magnetic powder mixture were mixed by a Turbula shaker under conditions of 67 rpm and 30 min to obtain a powder mixture for pressure sintering. The volume ratio of the metal Co powder (magnetic metal powder) to the obtained entire powder mixture for pressure sintering is 36.3 vol %.

The obtained powder mixture (30 g) for pressure sintering was subjected to hot pressing under the conditions of sintering temperature: 1190° C., pressure: 31 MPa, time: 30 min, and atmosphere: $5 \times 10^{-2}$ Pa or lower to prepare a sintered test piece (ϕ30 mm). The relative density of the prepared sintered test piece was 97.593%. The calculated density is 8.74 g/cm$^3$.

Figure 11:
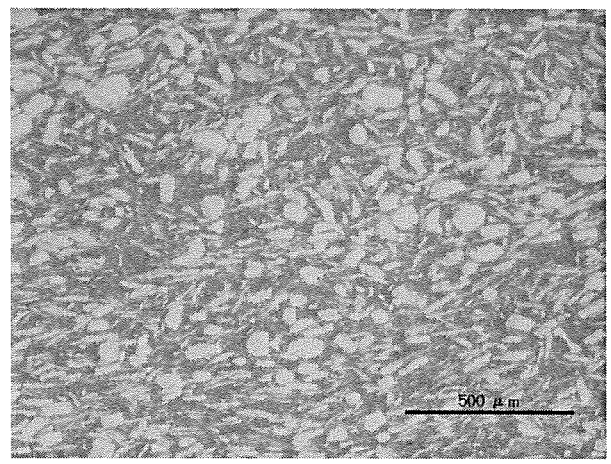
FIG. 11 is a metallurgical microscope photograph of the cross section in the thickness direction of a sintered test piece according to Example 5 at low magnification (an image taken at a magnification of 100×; a bar scale in the photograph represents 500 μm).
Figure 12:
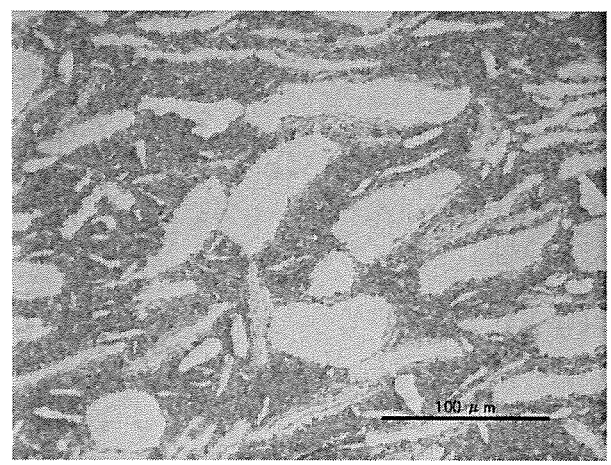
FIG. 12 is a metallurgical microscope photograph of the cross section in the thickness direction of a sintered test piece according to Example 5 at high magnification (an image taken at a magnification of 500×; a bar scale in the photograph represents 100 μm).

FIG. 11 and FIG. 12 are metallurgical microscope photograph of the cross section in the thickness direction of the obtained sintered test piece. FIG. 11 is a photograph at a photographing magnification of 100 times (a bar scale in the photograph represents 500 μm), and FIG. 12 is a photograph at a photographing magnification of 500 times (a bar scale in the photograph represents 100 μm).

In FIGS. 11 and 12, the gray phase is a non-magnetic phase in which the 34.091Co-22.727Cr-31.818Pt-11.364Ru alloy phase (non-magnetic metal phase) and the oxides (SiO$_2$, Cr$_2$O$_3$) are finely dispersed in each other, and the elongated white phases dispersed in this non-magnetic phase are Co phases (magnetic metal phases).

Since the 34.091Co-22.727Cr-31.818Pt-11.364Ru alloy powder has been mixed with the oxide powders with a ball mill up to the cumulative revolution number of 2,988,000, it is considered that the 34.091Co-22.727Cr-31.818Pt-11.364Ru alloy phase and the oxides are finely dispersed in each other and thus this dispersion was observed as the gray single phase in the metallurgical microscope photographs of FIGS. 11 and 12. On the other hand, the Co powder has been mixed and dispersed with the oxide powders with a ball mill, but the cumulative revolution number of the ball mill is 1,142,640, which is half or less of the cumulative revolution number of the ball mill in the mixing dispersion of the 34.091Co-22.727Cr-31.818Pt-11.364Ru alloy powder and the oxide powders. Therefore, it is considered that the mixing dispersion with a ball mill fails to cause fine dispersion between the Co powder and the oxide powders, and the Co phases were accordingly observed as the white phases in the metallurgical microscope photographs of FIGS. 11 and 12.

It is considered that the Co powder is mixed with a ball mill in this Example 5, and thus this may make the Co phases in the sintered test piece generally more elongated (larger aspect ratio) than those in Examples 1 to 4 in which Co powder is not mixed with a ball mill. The actual metallurgical microscope photograph of FIG. 12 shows that the volume ratio of white Co phases having an aspect ratio of 2 or more to the total Co phases is obviously 0.5 or more.

If aggregated oxides are present in the sintered test piece, they should be observed as black phases. In FIGS. 11 and 12, however, no black phases are found. Thus, no aggregated oxides having a longest diameter of 5 μm or larger are considered to be present in the sintered test piece obtained in this Example 5.

Next, the prepared powder mixture for pressure sintering was subjected to a hot press under the conditions of sintering temperature: 1190° C., pressure: 31 MPa, time: 60 min, and atmosphere: 5×10$^{-2}$ Pa or lower to prepare a target with φ152.4 mm and a thickness of 5.0 mm. The relative density of the prepared target was 99.174%.

The leakage magnetic flux from the prepared target was evaluated as in Example 1. As shown in TABLE 6 below, the average leakage magnetic flux ratio was 69.2%.

TABLE 6

| | Source Field(G) | Reference Field(G) | Leakage magnetic flux density(G) | Leakage magnetic flux ratio(%) |
|---|---|---|---|---|
| 0° | 886 | 626 | 432 | 69.0 |
| 30° | 886 | 626 | 431 | 68.9 |
| 60° | 886 | 626 | 433 | 69.2 |
| 90° | 886 | 626 | 435 | 69.5 |
| 120° | 886 | 626 | 434 | 69.3 |
| Average leakage magnetic flux ratio(%) | | | | 69.2 |

Example 6

The composition of the entire target prepared as Example 6 is 90(71Co-10Cr-14Pt-5Ru)-7SiO$_2$-3Cr$_2$O$_3$, which is the same as that in Example 1 to 5. Meanwhile, Co—Cr—Pt—Ru alloy powder of two types of atomized metal powders prepared (Co—Cr—Pt—Ru alloy powder, Co powder) has a composition of 34.091Co-22.727Cr-31.818Pt-11.364Ru as in Example 3 and 5. The atomic ratio of metal Cr to the total of metal Co and metal Cr that are contained in the 34.091Co-22.727Cr-31.818Pt-11.364Ru alloy powder (non-magnetic metal powder) is 40 at %.

In Examples 1 to 4, the Co—Cr—Pt—Ru alloy powder is mixed and dispersed with the oxide powders with a ball mill, whereas the Co powder is not subjected to mixing dispersion with a ball mill. Meanwhile, in this Example 6, as in Example 5, the Co powder is also mixed and dispersed with the oxide powders with a ball mill.

The target in the present Example 6 was prepared and evaluated as follows.

Atomization and size classification were performed in the same manner as in Example 1 to 4 except that the composition of the Co—Cr—Pt—Ru alloy powder was 34.091Co-22.727Cr-31.818Pt-11.364Ru as in Example 5, thereby obtaining 34.091Co-22.727Cr-31.818Pt-11.364Ru alloy powder (particle size: 106 μm or smaller) and Co powder (particle size: 45 to 106 μm).

To 1055.87 g of the obtained 34.091Co-22.727Cr-31.818Pt-11.364Ru alloy powder, 99.28 g of a SiO$_2$ powder and 107.60 g of a Cr$_2$O$_3$ powder were added. Then, the mixture was mixed and dispersed by a ball mill (with the cumulative number of ball mill revolutions of 2,988,000 as in Example 5) to obtain a non-magnetic powder mixture.

The volume ratio of the 34.091Co-22.727Cr-31.818Pt-11.364Ru alloy powder (non-magnetic metal powder) to the obtained entire non-magnetic powder mixture is 54.0 vol %, the volume ratio of the oxide powders (the total of SiO$_2$ powder and Cr$_2$O$_3$ powder) thereto is 46.0 vol %. Therefore, the volume ratio of the oxide powders (the total of SiO$_2$ powder and Cr$_2$O$_3$ powder) to the 34.091Co-22.727Cr-31.818Pt-11.364Ru alloy powder (non-magnetic metal powder) is as small as 0.852. It is thus considered that the 34.091Co-22.727Cr-31.818Pt-11.364Ru alloy powder (non-magnetic metal powder) may be easily mixed well with the oxide powders.

To 882.57 g of the obtained Co powder, 8.20 g of a SiO$_2$ powder and 8.89 g of a Cr$_2$O$_3$ powder were added. Then, the mixture was mixed and dispersed by a ball mill (with the cumulative number of ball mill revolutions of 1,578,960, which is larger by about 38% than 1,142,640 that is the cumulative number of a ball mill revolutions in Example 5) to obtain a magnetic powder mixture.

Next, 591.45 g of the obtained non-magnetic powder mixture and 358.56 g of the magnetic powder mixture were mixed by a Turbula shaker under conditions of 67 rpm and 30 min to obtain a powder mixture for pressure sintering. The volume ratio of the metal Co powder (magnetic metal powder) to the obtained entire powder mixture for pressure sintering is 36.3 vol %.

The obtained powder mixture (30 g) for pressure sintering was subjected to hot pressing under the conditions of sintering temperature: 1190° C., pressure: 31 MPa, time: 30 min, and atmosphere: 5×10$^{-2}$ Pa or lower to prepare a sintered test piece (φ30 mm). The relative density of the prepared sintered test piece was 98.053%. The calculated density is 8.74 g/cm$^3$.

Figure 13:
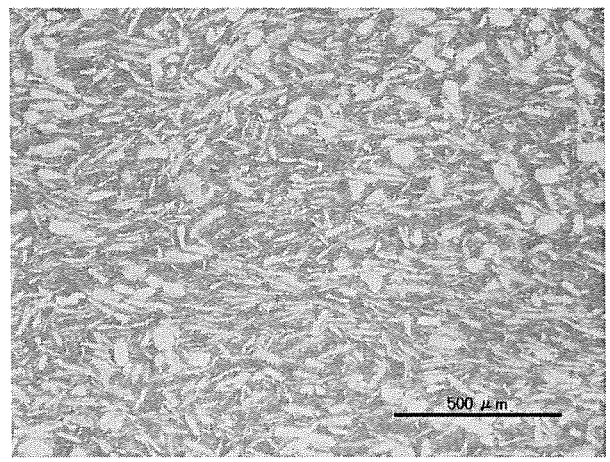
FIG. 13 is a metallurgical microscope photograph of the cross section in the thickness direction of a sintered test piece according to Example 6 at low magnification (an image taken at a magnification of 100×; a bar scale in the photograph represents 500 μm).
Figure 14:
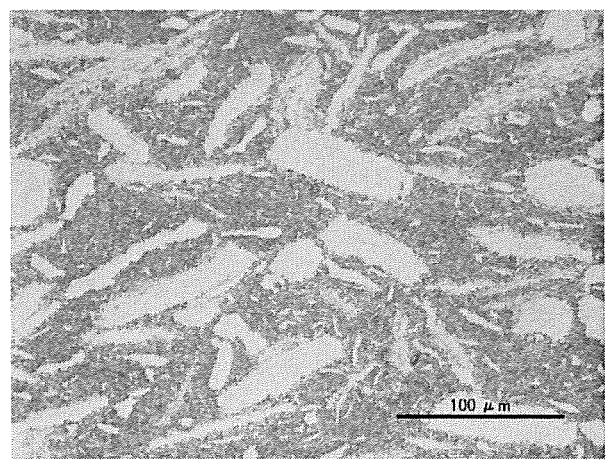
FIG. 14 is a metallurgical microscope photograph of the cross section in the thickness direction of a sintered test piece according to Example 6 at high magnification (an image taken at a magnification of 500×; a bar scale in the photograph represents 100 μm).

FIG. 13 and FIG. 14 are metallurgical microscope photograph of the cross section in the thickness direction of the obtained sintered test piece. FIG. 13 is a photograph at a photographing magnification of 100 times (a bar scale in the photograph represents 500 μm), and FIG. 14 is a photograph at a photographing magnification of 500 times (a bar scale in the photograph represents 100 μm).

In FIGS. 13 and 14, the gray phase is a non-magnetic phase in which the 34.091Co-22.727Cr-31.818Pt-11.364Ru alloy phase (non-magnetic metal phase) and the oxides (SiO$_2$, Cr$_2$O$_3$) are finely dispersed in each other, and the elongated white phases dispersed in this non-magnetic phase are Co phases (magnetic metal phases).

Since the 34.091Co-22.727Cr-31.818Pt-11.364Ru alloy powder has been mixed with the oxide powders with a ball mill up to the cumulative revolution number of 2,988,000, it is considered that the 34.091Co-22.727Cr-31.818Pt-11.364Ru alloy phase and the oxides are finely dispersed in each other and thus this dispersion was observed as the gray single phase in the metallurgical microscope photographs of FIGS. 13 and 14. On the other hand, the Co powder has been mixed and dispersed with the oxide powders with a ball mill, but the cumulative number of the ball mill revolution is 1,578,960, which is about half of the cumulative number of the ball mill revolution in the mixing dispersion of the 34.091Co-22.727Cr-31.818Pt-11.364Ru alloy powder and the oxide powders. Therefore, it is considered that the mixing dispersion with a ball mill fails to cause fine dispersion between the Co powder and the oxide powders, and the Co phases were accordingly observed as the white phases in the metallurgical microscope photographs of FIGS. 13 and 14.

It is considered that the Co powder is mixed with a ball mill in this Example 6, and thus this may make the Co phases in the sintered test piece generally more elongated (larger aspect ratio) than those in Examples 1 to 4 in which Co powder is not mixed with a ball mill. The actual metallurgical microscope photograph of FIG. 14 shows that the volume ratio of white Co phases having an aspect ratio of 2 or more to the total Co phases is obviously 0.5 or more.

If aggregated oxides are present in the sintered test piece, they should be observed as black phases. In FIGS. 13 and 14, however, no black phases are found. Thus, no aggregated oxides having a longest diameter of 5 μm or larger are considered to be present in the sintered test piece obtained in this Example 6.

Next, the prepared powder mixture for pressure sintering was subjected to a hot press under the conditions of sintering temperature: 1190° C., pressure: 31 MPa, time: 60 min, and atmosphere: $5 \times 10^{-2}$ Pa or lower to prepare a target with φ152.4 mm and a thickness of 5.0 mm. The relative density of the prepared target was 98.962%.

The leakage magnetic flux from the prepared target was evaluated as in Example 1. As shown in TABLE 7 below, the average leakage magnetic flux ratio was 66.5%.

TABLE 7

| | Source Field(G) | Reference Field(G) | Leakage magnetic flux density(G) | Leakage magnetic flux ratio(%) |
|---|---|---|---|---|
| 0° | 893 | 626 | 416 | 66.5 |
| 30° | 893 | 626 | 415 | 66.3 |
| 60° | 893 | 626 | 416 | 66.5 |
| 90° | 893 | 626 | 417 | 66.6 |
| 120° | 893 | 626 | 416 | 66.5 |
| Average leakage magnetic flux ratio(%) | | | | 66.5 |

Comparative Example 1

The composition of the entire target prepared as Comparative Example 1 is 90(71Co-10Cr-14Pt-5Ru)-7SiO$_2$-3Cr$_2$O$_3$, which is the same as those in Examples 1 to 6. On the other hand, the composition of alloy powder of two types of atomized metal powders prepared (Cr—Pt—Ru alloy powder, Co powder) is 34.483Cr-48.276Pt-17.241Ru. This alloy powder is free of Co, i.e., the Co content ratio is zero (the atomic ratio of metal Cr to the total of metal Co and metal Cr that are contained in the 34.483Cr-48.276Pt-17.241Ru alloy powder (non-magnetic metal powder) is 100 at %). Comparative Example 1 is different in this point from Examples 1 to 6 in which the alloy powder contains Co. In this Comparative Example 1, the volume of Co powder (the mass ratio of Co powder to Cr—Pt—Ru alloy powder) to be used is increased as the alloy powder is free of Co, and thus the composition of the entire target is the same as those in Examples 1 to 6.

The target in the present Comparative Example 1 was prepared and evaluated as follows.

Atomization and size classification were performed in the same manner as in Example 1 to 6 except that the composition of the alloy powder was 34.483Cr-48.276Pt-17.241Ru, thereby obtaining 34.483Cr-48.276Pt-17.241Ru alloy powder (particle size: 106 μm or smaller) and Co powder (particle size: 45 to 106 μm).

To 476.47 g of the obtained 34.483Cr-48.276Pt-17.241Ru alloy powder, 59.27 g of a SiO$_2$ powder and 64.26 g of a Cr$_2$O$_3$ powder were added. Then, the mixture was mixed and dispersed by a ball mill (with the cumulative number of ball mill revolutions of 2,988,000) to obtain a non-magnetic powder mixture.

Next, 504.10 g of the obtained non-magnetic powder mixture and 445.90 g of the classified Co powder (the magnetic metal powder) were mixed by a Turbula shaker under conditions of 67 rpm and 30 min to obtain a powder mixture for pressure sintering.

The volume ratio of the 34.483Cr-48.276Pt-17.241Ru alloy powder (non-magnetic metal powder) to the obtained entire powder mixture for pressure sintering is 23.6 vol %, the volume ratio of the oxide powders (the total of SiO$_2$ powder and Cr$_2$O$_3$ powder) thereto is 30.3 vol %, and the volume ratio of metal Co powder (magnetic metal powder) thereto is 46.1 vol %. Therefore, the volume ratio of the oxide powders (the total of SiO$_2$ powder and Cr$_2$O$_3$ powder) to the 34.483Cr-48.276Pt-17.241Ru alloy powder (non-magnetic metal powder) is 1.284, which is larger than that of Example 1 to 6. Thus, it may be more difficult to achieve good mixing of the 34.483Cr-48.276Pt-17.241Ru alloy powder (non-magnetic metal powder) with the oxide powders than in Examples 1 to 6.

The obtained powder mixture (30 g) for pressure sintering was subjected to hot pressing under the conditions of sintering temperature: 1190° C., pressure: 31 MPa, time: 30 min, and atmosphere: $5 \times 10^{-2}$ Pa or lower to prepare a sintered test piece (φ30 mm). The relative density of the prepared sintered test piece was 97.741%. The calculated density is 8.74 g/cm$^3$.

Figure 15:
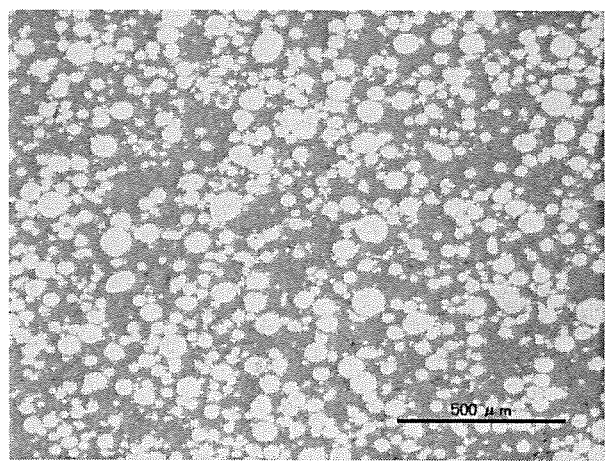
FIG. 15 is a metallurgical microscope photograph of the cross section in the thickness direction of a sintered test piece according to Comparative Example 1 at low magnification (an image taken at a magnification of 100×; a bar scale in the photograph represents 500 μm).
Figure 16:
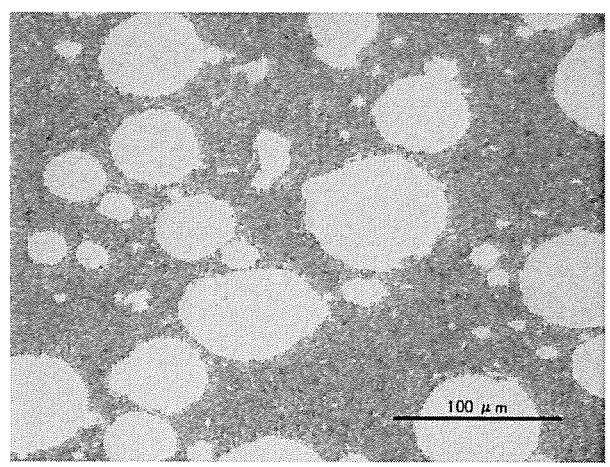
FIG. 16 is a metallurgical microscope photograph of the cross section in the thickness direction of a sintered test piece according to Comparative Example 1 at high magnification (an image taken at a magnification of 500×; a bar scale in the photograph represents 100 μm).

FIG. 15 and FIG. 16 are metallurgical microscope photograph of the cross section in the thickness direction of the obtained sintered test piece. FIG. 15 is a photograph at a photographing magnification of 100 times (a bar scale in the photograph represents 500 μm), and FIG. 16 is a photograph at a photographing magnification of 500 times (a bar scale in the photograph represents 100 μm).

In FIGS. 15 and 16, the gray phase is a non-magnetic phase in which the 34.483Cr-48.276Pt-17.241Ru alloy phase (non-magnetic metal phase) and the oxides (SiO$_2$, Cr$_2$O$_3$) are finely dispersed in each other, and the approximate circular white phases dispersed in this non-magnetic phase are Co phases (magnetic metal phases). Since the 34.483Cr-48.276Pt-17.241Ru alloy powder had been mixed with the oxide powders with a ball mill up to the cumulative revolution number of 2,988,000, it is considered that the 34.483Cr-48.276Pt-17.241Ru alloy phase and the oxide phase are finely dispersed in each other and this dispersion may be accordingly observed as the gray single phase in the metallurgical microscope photographs of FIGS. 15 and 16. On the other hand, it is considered that the Co powder maintains the approximately spherical shape because of lack of mixing with a ball mill.

If aggregated oxides are present in the sintered test piece, they should be observed as black phases. In FIGS. 15 and 16, not many but some small black phases are observed. Relatively many small black phases are found near the left side and right side of FIG. 16, and larger phases of these have a longest diameter of about 5 μm according to the scale at the lower right of FIG. 16. Thus, aggregated oxides having a longest diameter of 5 μm or larger are considered to be present in the sintered test piece obtained in this Comparative Example 1.

Therefore, sputtering using the target obtained in this Comparative Example 1 may impose a risk of increased occurrence of defects such as nodules and particles.

Next, the prepared powder mixture for pressure sintering was subjected to a hot press under the conditions of sintering temperature: 1190° C., pressure: 31 MPa, time: 60 min, and atmosphere: $5 \times 10^{-2}$ Pa or lower to prepare a target with φ152.4 mm and a thickness of 5.0 mm. The relative density of the prepared target was 99.113%.

The leakage magnetic flux from the prepared target was evaluated as in Example 1. As shown in TABLE 8 below, the average leakage magnetic flux ratio was 75.2%.

TABLE 8

| | Source Field(G) | Reference Field(G) | Leakage magnetic flux density(G) | Leakage magnetic flux ratio(%) |
|---|---|---|---|---|
| 0° | 884 | 624 | 470 | 75.3 |
| 30° | 884 | 624 | 470 | 75.3 |
| 60° | 884 | 624 | 469 | 75.2 |
| 90° | 884 | 624 | 469 | 75.2 |
| 120° | 884 | 624 | 469 | 75.2 |
| Average leakage magnetic flux ratio(%) | | | | 75.2 |

Comparative Example 2

The composition of the entire target prepared as Comparative Example 2 is 90(71Co-10Cr-14Pt-5Ru)-7SiO$_2$-3Cr$_2$O$_3$, which is the same as those in Examples 1 to 6 and Comparative Example 1.

In this Comparative Example 2, however, atomized metal powder prepared is one type of 71Co-10Cr-14Pt-5Ru alloy powder, and this type of atomized metal powder is mixed with oxide powders (SiO$_2$ powder, Cr$_2$O$_3$ powder) to prepare a powder mixture for pressure sintering. Accordingly, Comparative Example 2 is different from Examples 1 to 6 and Comparative Example 1 in that two types of atomized metal powders (Co—Cr—Pt—Ru alloy powder and Co powder in Examples 1 to 6; Cr—Pt—Ru alloy powder and Co powder in Comparative Example 1) are not used for preparing a powder mixture for pressure sintering. In the target prepared in this Comparative Example 2, the metal phase is thus only a Co—Cr—Pt—Ru alloy phase with no Co phase.

The atomic ratio of Cr to the total of Co and Cr in the 71Co-10Cr-14Pt-5Ru alloy phase is 12.3 at %, and the 71Co-10Cr-14Pt-5Ru alloy phase is thus expected to be a magnetic alloy phase according to Table 1 and FIG. 1. Furthermore, the atomic ratio of Pt to the total of Co and Pt in the 71Co-10Cr-14Pt-5Ru alloy phase is 16.5 at %. Thus, the alloy phase with this component composition is expected to have higher magnetism than alloys free of Pt because Pt is considered to have a function of increasing the magnetic moment of Co in this component composition.

In Examples 1 to 6, on the other hand, the atomic ratio of Cr to the total of Co and Cr in the Co—Cr—Pt—Ru alloy phase is 30 at % or more, and the Co—Cr—Pt—Ru alloy phase is thus expected to be a non-magnetic alloy phase according to Table 1 and FIG. 1. Since the Cr—Pt—Ru alloy phase in Comparative Example 1 is free of Co, the Cr—Pt—Ru alloy phase is expected to be a non-magnetic alloy phase.

The target in the present Comparative Example 2 was prepared and evaluated as follows.

71Co-10Cr-14Pt-5Ru alloy powder (particle size: 106 μm or smaller) was prepared by performing atomization and size classification in the same manner as in Examples 1 to 4 and Comparative Example 1 except that the composition of the alloy powder to be prepared was 71Co-10Cr-14Pt-5Ru and Co powder was not prepared.

To 1780.00 g of the prepared 71Co-10Cr-14Pt-5Ru alloy powder, 104.75 g of SiO$_2$ powder and 113.56 g of Cr$_2$O$_3$ powder were added. The mixture was subjected to mixing dispersion with a ball mill to provide two types of magnetic powder mixtures with different cumulative revolution numbers of the ball mill (magnetic powder mixture with a ball mill cumulative revolution number of 2,988,000 and magnetic powder mixture with a ball mill cumulative revolution number of 3,906,000).

In this Comparative Example 2, Co powder is not further mixed unlike Examples 1 to 4 and Comparative Example 1, and the magnetic powder mixture obtained here is defined as a powder mixture for pressure sintering.

The volume ratio of the 71Co-10Cr-14Pt-5Ru alloy powder (magnetic metal powder) to the obtained entire magnetic powder mixture (powder mixture for pressure sintering) is 69.6 vol %, the volume ratio of the oxide powders (the total of SiO$_2$ powder and Cr$_2$O$_3$ powder) thereto is 30.4 vol, and the volume ratio of metal Co powder (magnetic metal powder) thereto is 0 vol %. Therefore, the volume ratio of the oxide powders (the total of SiO$_2$ powder and Cr$_2$O$_3$ powder) to the 71Co-10Cr-14Pt-5Ru alloy powder (magnetic metal powder) is 0.437.

The magnetic powder mixture (30 g) with a ball mill cumulative revolution number of 2,988,000 was subjected to hot pressing under the conditions of sintering temperature: 1200° C., pressure: 24.5 MPa, time: 30 min, and atmosphere: 5×10$^{-2}$ Pa or lower to prepare a sintered test piece (φ30 mm). The relative density of the prepared sintered test piece was 96.305%. The magnetic powder mixture (30 g) with a ball mill cumulative revolution number of 3,906,000 was also subjected to hot pressing under the same conditions to prepare a sintered test piece (φ30 mm). The relative density of the prepared sintered test piece was 96.675%. The calculated density is 8.74 g/cm$^3$.

Figure 17:
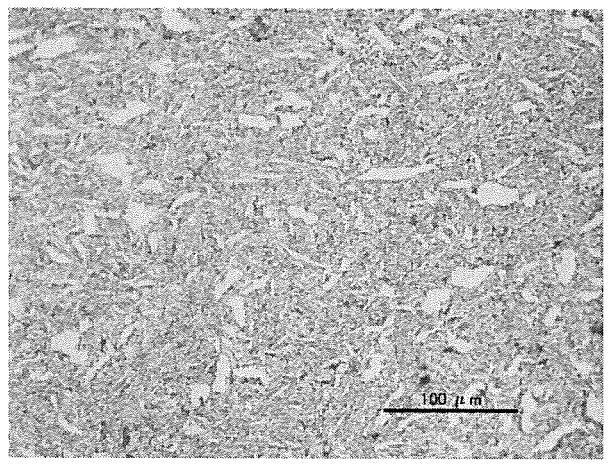
FIG. 17 is a metallurgical microscope photograph of the cross section in the thickness direction of a sintered test piece according to Comparative Example 2 (produced using the magnetic powder mixture mixed until the cumulative number of ball mill revolutions reached 2,988,000) at low magnification (an image taken at a magnification of 400×; a bar scale in the photograph represents 100 μm).
Figure 18:
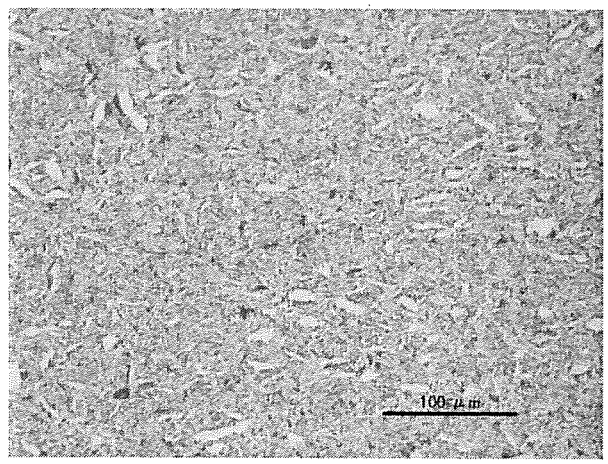
FIG. 18 is a metallurgical microscope photograph of the cross section in the thickness direction of a sintered test piece according to Comparative Example 2 (produced using the magnetic powder mixture mixed until the cumulative number of ball mill revolutions reached 3,906,000) at high magnification (an image taken at a magnification of 400×; a bar scale in the photograph represents 100 μm).

FIG. 17 is the metallurgical microscope photograph of the cross section of the sintered test piece in the thickness direction wherein the sintered test piece is prepared using the magnetic powder mixture with a ball mill cumulative revolution number of 2,988,000. FIG. 18 is the metallurgical microscope photograph of the cross section of the sintered test piece in the thickness direction wherein the sintered test piece is prepared using the magnetic powder mixture with a ball mill cumulative revolution number of 3,906,000. Both the photographs were taken at a magnification of 400 times (the bar scale in the photographs represents 100 μm).

In FIGS. 17 and 18, relatively elongated white phases are the 71Co-10Cr-14Pt-5Ru alloy phases (magnetic metal phases), and gray phases are magnetic phases in which the 71Co-10Cr-14Pt-5Ru alloy phases (magnetic metal phases) and the oxides (SiO$_2$, Cr$_2$O$_3$) are finely dispersed in each other.

If aggregated oxides are present in the sintered test piece, they should be observed as black phases. In FIGS. 17 and 18, relatively large black phases are found substantially all over the photographs. Larger black phases of these have a longest diameter of about 10 to 15 μm according to the scale at the lower right of FIGS. 17 and 18. Thus, aggregated oxides having a longest diameter of 5 μm or larger are considered to be present in the sintered test piece obtained in this Comparative Example 2.

Although the reason was not clear, the 71Co-10Cr-14Pt-5Ru atomized alloy powder prepared in this Comparative Example 2 was harder than the atomized alloys powder prepared in Examples 1 to 4 and Comparative Example 1. It is considered that this hardness caused poor mixing of the atomized alloy powder and the oxide powders. It is assumed that this poor mixing generated the 71Co-10Cr-14Pt-5Ru alloy phases (magnetic metal phases) that failed to achieve mutual dispersion with the oxides, and the aggregated oxides in the sintered test piece.

Therefore, sputtering using the target obtained in this Comparative Example 2 may impose a risk of increased occurrence of defects such as nodules and particles.

Next, the prepared powder mixture for pressure sintering (with a ball mill cumulative revolution number of 3,906,000) was subjected to a hot press under the conditions of sintering temperature: 1200° C., pressure: 24.5 MPa, time: 60 min, and atmosphere: 5×10$^{-2}$ Pa or lower to prepare four targets with 9152.4 mm and a thickness of 5.0 mm. The relative densities of the four prepared target were 98.4%, 98.4%, 98.4%, 98.5%.

The leakage magnetic fluxes from the prepared targets were evaluated as in Example 1. The average leakage magnetic flux rates of four prepared targets were 49.3%, 49.2%, 49.3%, and 49.2% (described corresponding to the order of the relative density), respectively, which were much smaller than those in Examples 1 to 6 and Comparative Example 1.

(Discussion)

The measured results of the average leakage magnetic flux rate in Examples 1 to 4 and Comparative Examples 1 and 2 are summarized in Table 9 below. It is noted that the comprehensive evaluation is rated as 'AA' when the average leakage magnetic flux rate of the target is 70.0% or more and no aggregated oxides having a longest diameter of 5 μm or larger are present; the comprehensive evaluation is rated as 'A' when the average leakage magnetic flux rate of the target is 65.0% or more and no aggregated oxides having a longest diameter of 5 μm or larger are present; the comprehensive evaluation is rated as 'B' when the average leakage magnetic flux rate of the target is 70.0% or more but aggregated oxides having a longest diameter of 5 μm or larger are present; and the comprehensive evaluation is rated as 'C' when the average leakage magnetic flux rate of the target is less than 70.0% and aggregated oxides having a longest diameter of 5 μm or larger are present.

TABLE 9

| | | Matrix phase | | | Volume fraction of dispersed phase (Co Phase) to entire target (vol %) | Aggregated oxides with longest diameter of 5 μm or larger | Relative density of target (%) | Average leakage magnetic flux rate (%) | Comprehensive evaluation |
|---|---|---|---|---|---|---|---|---|---|
| | Composition of target | Ratio of metal Cr to total of metal Co and metal Cr (at %) | Volume ratio of oxides to metal phase (vol %) | Atomic ratio of metal Co to all metals (at %) | | | | | |
| Example 1 | Total composition: 90(71Co—10Cr—14Pt—5Ru)—7SiO$_2$—3Cr$_2$O$_3$<br>Atomic ratio of metal Cr to metal Co and metal Cr in total composition: 12.3 at %<br>Metal phase in matrix phase: 44.586Co—19.108Cr—26.752Pt—9.554Ru<br>Oxides in matrix phase: 70SiO$_2$—30Cr$_2$O$_3$<br>Dispersed phase: metal Co (no ball mill mixing of Co powder) | 30 | 0.786 | 44.586 | 30.9 | − | 98.430 | 70.0 | AA |
| Example 2 | Total composition: 90(71Co—10Cr—14Pt—5Ru)—7SiO$_2$—3Cr$_2$O$_3$<br>Atomic ratio of metal Cr to metal Co and metal Cr in total composition: 12.3 at %<br>Metal phase in matrix phase: 39.038Co—21.021Cr—29.430Pt—10.511Ru<br>Oxides in matrix phase: 70SiO$_2$—30Cr$_2$O$_3$<br>Dispersed phase: metal Co (no ball mill mixing of Co powder) | 35 | 0.854 | 39.038 | 34.0 | − | 98.399 | 72.2 | AA |
| Example 3 | Total composition: 90(71Co—10Cr—14Pt—5Ru)—7SiO$_2$—3Cr$_2$O$_3$<br>Atomic ratio of metal Cr to metal Co and metal Cr in total composition: 12.3 at %<br>Metal phase in matrix phase: 34.091Co—22.727Cr—31.818Pt—11.364Ru<br>Oxides in matrix phase: 70SiO$_2$—30Cr$_2$O$_3$<br>Dispersed phase: metal Co (no ball mill mixing of Co powder) | 40 | 0.913 | 34.091 | 36.3 | − | 98.573 | 73.4 | AA |
| Example 4 | Total composition: 90(71Co—10Cr—14Pt—5Ru)—7SiO$_2$—3Cr$_2$O$_3$<br>Atomic ratio of metal Cr to metal Co and metal Cr in total composition: 12.3 at %<br>Metal phase in matrix phase: 18.692Co—28.037Cr—39.252Pt—14.019Ru<br>Oxides in matrix phase: 70SiO$_2$—30Cr$_2$O$_3$<br>Dispersed phase: metal Co (no ball mill mixing of Co powder) | 60 | 1.086 | 18.692 | 41.8 | − | 99.243 | 74.7 | AA |
| Example 5 | Total composition: 90(71Co—10Cr—14Pt—5Ru)—7SiO$_2$—3Cr$_2$O$_3$<br>Atomic ratio of metal Cr to metal Co and metal Cr in total composition: 12.3 at %<br>Metal phase in matrix phase: 34.091Co—22.727Cr—31.818Pt—11.364Ru<br>Oxides in matrix phase: 70SiO$_2$—30Cr$_2$O$_3$<br>Dispersed phase: metal Co (cumulative revolution number of ball mill mixing of Co powder: 1,142,640) | 40 | 0.852 | 33.460 | 36.3 | − | 99.174 | 69.2 | A |
| Example 6 | Total composition: 90(71Co—10Cr—14Pt—5Ru)—7SiO$_2$—3Cr$_2$O$_3$<br>Atomic ratio of metal Cr to metal Co and metal Cr in total composition: 12.3 at %<br>Metal phase in matrix phase: 34.091Co—22.727Cr—31.818Pt—11.364Ru<br>Oxides in matrix phase: 70SiO$_2$—30Cr$_2$O$_3$  Dispersed phase: metal Co (cumulative revolution number of ball mill mixing of Co powder 1,578,960) | 40 | 0.852 | 33.460 | 36.3 | + | 98.962 | 66.5 | A |
| Comparative Example 1 | Total composition: 90(71Co—10Cr—14Pt—5Ru)—7SiO$_2$—3Cr$_2$O$_3$<br>Atomic ratio of metal Cr to metal Co and metal Cr in total composition: 12.3 at %<br>Metal phase in matrix phase: 34.483Cr—48.276Pt—17.241Ru<br>Oxides in matrix phase: 70SiO$_2$—30Cr$_2$O$_3$<br>Dispersed phase: metal Co (no ball mill mixing of Co powder) | 100 | 1.284 | 0 | 46.1 | + | 99.113 | 75.2 | B |
| Comparative Example 2 | Total composition: 90(71Co—10Cr—14Pt—5Ru)—7SiO$_2$—3Cr$_2$O$_3$<br>Atomic ratio of metal Cr to metal Co and metal Cr in total composition: 12.3 at %<br>Metal phase in matrix phase: 71Co—10Cr—14Pt—5Ru<br>Oxides in matrix phase: 70SiO$_2$—30Cr$_2$O$_3$  Dispersed Phase: None | 12.3 | 0.437 | 71 | 0.0 | − | 98.425 | 49.3 | C |

Examples 1 to 6 (the composition of the entire targets is 90(71Co-10Cr-14Pt-5Ru)-7SiO$_2$-3Cr$_2$O$_3$) are targets containing metal Co, metal Cr, and oxides with the atomic ratio of the metal Cr to the total of the metal Co and the metal Cr being more than 0 at % and less than 25 at %. The targets include a non-magnetic metal phase containing metal Co and metal Cr with the atomic ratio of the metal Cr to the total of the metal Co and the metal Cr being 25 at % or more and less than 100 at %, and magnetic metal phases containing metal Co. The volume ratio of the oxides to the non-magnetic metal phase is more than 0 and 1.2 or less, and no aggregated oxides having a longest diameter of 5 μm or larger are present in the targets. Therefore, the targets of Examples 1 to 6 are within the scope of the present invention.

In Examples 1 to 6, the dispersed phase is a metal Co single phase and more metal Co in the target is contained in the dispersed phase and accordingly, the amount of metal Co in the matrix phase decreases. The atomic ratio of metal Cr to the total of metal Co and metal Cr in the matrix phase is 25 at % or more, which makes the matrix phase non-magnetic. Thus the volume fraction of the magnetic phase (metal Co single phase) can be reduced to increase the average leakage magnetic flux rate of the target with a constant Co content in the entire target. The actual average leakage magnetic flux rates in Examples 1 to 6 were as large as 70.0%, 72.2%, 73.4%, 74.7%, 69.2%, and 66.5% respectively, which were all 65% or more.

In Examples 1 to 6, the volume ratio of the oxide powders (the total of SiO$_2$ powder and Cr$_2$O$_3$ powder) to the non-magnetic Co—Cr—Pt—Ru alloy powder is 1.2 or less in the preparation of the non-magnetic powder mixture. This small volume ratio of the oxide powders to the non-magnetic Co—Cr—Pt—Ru alloy powder facilitates good mixing of the non-magnetic Co—Cr—Pt—Ru alloy powder with the oxide powders. In Examples 1 to 6, no aggregated oxides having a longest diameter of 5 μm or larger were actually observed in the obtained targets.

As described above, the targets of Examples 1 to 6 within the scope of the present invention all had an average leakage magnetic flux rate of 65.0% or more, and no aggregated oxides having a longest diameter of 5 μm or larger were observed in the targets. Therefore, the use of the targets of Examples 1 to 6 within the scope of the present invention enables favorable magnetron sputtering and further prevents generation of defects such as nodules and particles during sputtering.

Next, the difference between Examples 5 and 6 and Examples 1 to 4 will be discussed. In Examples 1 to 4, the Co—Cr—Pt—Ru alloy powder is mixed and dispersed with the oxide powders with a ball mill, but the Co powder is not subjected to mixing dispersion with a ball mill. Meanwhile, in Examples 5 and 6, the Co powder is also mixed and dispersed with the oxide powders with a ball mill.

FIGS. 3 to 14 thus show that in Examples 1 to 4, the Co phases in the targets maintain the approximately spherical shape, whereas in Examples 5 and 6, the Co phases in the targets generally have an elongated shape and the volume ratio of the Co phases having an aspect ratio of 2 or more to the total Co phases exceeds 0.5.

This may be the reason that the average leakage magnetic flux rate is 65% or more but less than 70% in Examples 5 and 6, which is unlike Examples 1 to 4 where the average leakage magnetic flux rate is 70% or more.

The difference between Examples 5 and 6 is that the cumulative number of the ball mill revolution during mixing dispersion with the ball bill after adding the oxide powders to the prepared Co powder is 1,142,640 in Example 5 and 1,578,960 in Example 6, i.e., the cumulative revolution number in Example 6 is about 38% more than that in Example 5. It is considered that this difference may make the Co phases in the target of Example 6 generally more elongated (larger volume ratio of the Co phases having an aspect ratio of 2 or more to the total Co phases) than those in the target of Example 5. This may make the average leakage magnetic flux rate in Example 6 smaller than that in Example 5.

Although the mechanisms by which the average leakage magnetic flux rate of the target becomes smaller with generally more elongated Co phases (magnetic metal phases) (larger aspect ratio of the Co phases (magnetic metal phases)) are not clear at present, it is considered that the result of comparison between Examples 1 to 4 and Examples 5 and 6 suggests that it is preferable not to provide the step of mixing and dispersing the Co powder (magnetic metal powder) with a ball mill in order to increase the average leakage magnetic flux rate. Absence of the step of mixing and dispersing the Co powder (magnetic metal powder) with a ball mill can prevent generation of generally more elongated Co phases (magnetic metal phases) (larger aspect ratio of Co phases (magnetic metal phases)), thus can reduce the volume ratio of the Co phases having an aspect ratio of 2 or more to the total Co phases to 0.5 or less, and can further increase the average leakage magnetic flux rate of the target.

To prevent aggregation of the oxides in the target, a powder mixture for pressure sintering in which the oxide powder and the metal powder are mixed and dispersed well with each other needs to be obtained. Thus, it is considered that the oxide powder and the non-magnetic metal powder may be preferably mixed and dispersed well with each other with a ball mill.

In Comparative Example 1, the composition of the entire target is 90(71Co-10Cr-14Pt-5Ru)-7SiO$_2$-3Cr$_2$O$_3$, which is the same as those in Examples 1 to 6. The composition of alloy powder of two types of atomized metal powders prepared (Cr—Pt—Ru alloy powder, Co powder) is 34.483Cr-48.276Pt-17.241Ru. This alloy powder is free of Co, i.e., the Co content ratio is zero. Because of this, the volume of the non-magnetic Cr—Pt—Ru alloy powder used for preparing a non-magnetic powder mixture is smaller as the Co content ratio is zero, and the volume ratio of the oxide powders (the total of SiO$_2$ powder and Cr$_2$O$_3$ powder) to the non-magnetic Cr—Pt—Ru alloy powder is thus 1.288, which is relatively large and exceeds 1.2. It is considered that this volume ratio may cause poor mixing of the non-magnetic Cr—Pt—Ru alloy powder and the oxide powders to generate aggregated oxides having a longest diameter of 5 μm or larger in the obtained sintered test piece.

It is noted that the average leakage magnetic flux rate of the target is as large as 75.2% and excellent.

In Comparative Example 2, the composition of the entire target is 90(71Co-10Cr-14Pt-5Ru)-7SiO$_2$-3Cr$_2$O$_3$, which is the same as those in Examples 1 to 6 and Comparative Example 1. The atomized metal powder prepared is only one type (71Co-10Cr-14Pt-5Ru), and the obtained sintered product contains no metal Co single phase, i.e., the metal phase is only a 71Co-10Cr-14Pt-5Ru alloy phase. In this alloy phase, the atomic ratio of metal Cr to the total of metal Co and metal Cr is 12.3 at %, and this alloy phase is a magnetic phase as shown in Table 1 and FIG. 1. Therefore, all the metal phases in the target of Comparative Example 2 are magnetic phases, with no non-magnetic metal phase. It is considered that this may be the reason that the average leakage magnetic flux rate of the target of Comparative Example 2 was as small as 49.3%.

In Comparative Example 2, on the other hand, in the powder mixture for pressure sintering, the volume ratio of the oxide powders (the total of $SiO_2$ powder and $Cr_2O_3$ powder) to the Co—Cr—Pt—Ru alloy powder is as small as 0.436, which is below 1.2. In view of this point, it is considered that the Co—Cr—Pt—Ru alloy powder may be mixed well with the oxide powders. Although the reason was not clear, however, the Co—Cr—Pt—Ru alloy powder (71Co-10Cr-14Pt-5Ru alloy powder) used was harder than the alloy powders used in Examples 1 to 4 and Comparative Example 1, which hindered good mixing of the alloy powder with the oxide powder. It is assumed that this generated aggregated oxides having a longest diameter of 5 μm or larger in the obtained sintered test piece.

INDUSTRIAL APPLICABILITY

The target according to the present invention can be suitably used as a target for magnetron sputtering. The manufacturing method according to the present invention can be suitably used as a manufacturing method for a target for magnetron sputtering.

REFERENCE SIGNS LIST 10 target
12 magnetic metal phase
14 matrix phase

The invention claimed is:

1. A target for magnetron sputtering, comprising metal Co, metal Cr, and an oxide with an atomic ratio of the metal Cr to the total of the metal Co and the metal Cr being more than 0 at % and less than 25 at %,
   wherein the target comprises:
      a non-magnetic metal phase containing metal Co and metal Cr with an atomic ratio of the metal Cr to the total of the metal Co and the metal Cr being 25 at % or more and less than 100 at % and with an atomic ratio of the metal Co to the total of the metal Co and the other metals being more than 0 at % and 45 at % or less; and
      a magnetic metal phase containing metal Co;
   wherein a volume ratio of the oxide to the non-magnetic metal phase is more than 0 and 1.2 or less;
   wherein the non-magnetic metal phase and the oxide are mutually dispersed to form a matrix phase, and
   wherein the magnetic metal phase is dispersed in the matrix phase.

2. A target for magnetron sputtering, comprising metal Co, metal Cr, metal Pt, and an oxide with an atomic ratio of the metal Cr to the total of the metal Co and the metal Cr being more than 0 at % and less than 25 at %,
   wherein the target comprises:
      a non-magnetic metal phase containing metal Co, metal Cr, and metal Pt with an atomic ratio of the metal Cr to the total of the metal Co and the metal Cr being 25 at % or more and less than 100 at % and with an atomic ratio of the metal Co to the total of the metal Co and the other metals being more than 0 at % and 45 at % or less; and
      a magnetic metal phase containing metal Co;
   wherein a volume ratio of the oxide to the non-magnetic metal phase is more than 0 and 1.2 or less;
   wherein the non-magnetic metal phase and the oxide are mutually dispersed to form a matrix; and
   wherein the magnetic metal phase is dispersed in the matrix phase.

3. The target for magnetron sputtering according to claim 1, wherein a volume ratio of a magnetic metal phase having an aspect ratio of 2 or more among the magnetic metal phase is 0.5 or less to the total magnetic metal phase.

4. The target for magnetron sputtering according to claim 2, wherein a volume ratio of a magnetic metal phase having an aspect ratio of 2 or more among the magnetic metal phase is 0.5 or less to the total magnetic metal phase.

5. The target for magnetron sputtering according to claim 1, wherein the non-magnetic metal phase has the atomic ratio of the metal Cr to the total of the metal Co and the metal Cr contained being 30 at % or more and less than 100 at %.

6. The target for magnetron sputtering according to claim 2, wherein the non-magnetic metal phase has the atomic ratio of the metal Cr to the total of the metal Co and the metal Cr contained being 30 at % or more and less than 100 at %.

7. The target for magnetron sputtering according to claim 1, wherein the magnetic metal phase comprises the metal Co and metal Cr with the balance being unavoidable impurities, and has an atomic ratio of the metal Co to the total of the metal Co and the metal Cr being 85% or more and less than 100 at %.

8. The target for magnetron sputtering according to claim 2, wherein the magnetic metal phase comprises the metal Co and metal Cr with the balance being unavoidable impurities, and has an atomic ratio of the metal Co to the total of the metal Co and the metal Cr being 85% or more and less than 100 at %.

9. The target for magnetron sputtering according to claim 1, wherein the magnetic metal phase consists of the metal Co and unavoidable impurities.

10. The target for magnetron sputtering according to claim 2, wherein the magnetic metal phase consists of the metal Co and unavoidable impurities.

11. The target for magnetron sputtering according to claim 1, wherein the oxide contains at least one of $SiO_2$, $TiO_2$, $Ti_2O_3$, $Ta_2O_5$, $Cr_2O_3$, $CoO$, $Co_3O_4$, $B_2O_3$, $Fe_2O_3$, $CuO$, $Y_2O_3$, $MgO$, $Al_2O_3$, $ZrO_2$, $Nb_2O_5$, $MoO_0$, $CeO_2$, $Sm_2O_3$, $Gd_2O_3$, $WO_2$, $WO_3$, $HfO_2$, and $NiO_2$.

12. The target for magnetron sputtering according to claim 2, wherein the oxide contains at least one of $SiO_2$, $TiO_2$, $Ti_2O_3$, $Ta_2O_5$, $Cr_2O_3$, $CoO$, $Co_3O_4$, $B_2O_3$, $Fe_2O_3$, $CuO$, $Y_2O_3$, $MgO$, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

13. The target for magnetron sputtering according to claim 1, wherein the target can be used for forming a magnetic recording layer.

14. The target for magnetron sputtering according to claim 2, wherein the target can be used for forming a magnetic recording layer.

* * * * *